(12) United States Patent
Lub et al.

(10) Patent No.: US 10,514,152 B2
(45) Date of Patent: Dec. 24, 2019

(54) HIGHLY EFFICIENT MOLECULES SHOWING RESONANT ENERGY TRANSFER

(71) Applicant: SIGNIFY HOLDING B.V., Eindhoven (NL)

(72) Inventors: Johan Lub, Eindhoven (NL); Rifat Ata Mustafa Hikmet, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 361 days.

(21) Appl. No.: 15/505,226

(22) PCT Filed: Aug. 18, 2015

(86) PCT No.: PCT/EP2015/068959
§ 371 (c)(1),
(2) Date: Feb. 20, 2017

(87) PCT Pub. No.: WO2016/026863
PCT Pub. Date: Feb. 25, 2016

(65) Prior Publication Data
US 2017/0268746 A1    Sep. 21, 2017

(30) Foreign Application Priority Data

Aug. 21, 2014 (EP) .................................. 14181790

(51) Int. Cl.
| | | |
|---|---|---|
| H01L 51/54 | (2006.01) |
| F21V 9/30 | (2018.01) |
| C09B 5/62 | (2006.01) |
| C09K 11/06 | (2006.01) |
| H01L 33/50 | (2010.01) |
| C09B 69/10 | (2006.01) |
| F21V 7/22 | (2018.01) |
| F21V 9/08 | (2018.01) |
| H01L 51/50 | (2006.01) |

(52) U.S. Cl.
CPC .............. *F21V 9/30* (2018.02); *C09B 5/62* (2013.01); *C09B 69/103* (2013.01); *C09K 11/06* (2013.01); *F21V 7/22* (2013.01); *F21V 9/08* (2013.01); *H01L 33/502* (2013.01); *C09K 2211/1007* (2013.01); *C09K 2211/1011* (2013.01); *C09K 2211/1044* (2013.01); *H01L 33/507* (2013.01); *H01L 51/50* (2013.01)

(58) Field of Classification Search
CPC ..... F21V 9/16; F21V 9/08; F21V 7/22; C09B 5/62; C09B 69/103; C09K 11/06; C09K 2211/10; C09K 2211/1011; C09K 2211/1044; C09K 2211/1007; C09K 2211/1029; H01L 33/502; H01L 33/507; H01L 51/0032; H01L 51/005; H01L 51/0062; H01L 51/0067; H01L 51/0072; H01L 51/0071; H01L 51/50; H01L 51/5012; H01L 51/5016

USPC ....... 428/690, 691, 917, 411.4, 336; 427/58, 427/66; 313/500–512; 257/40, 88–104, 257/E51.001–E51.052; 252/301.16–301.35

See application file for complete search history.

(56) References Cited

U.S. PATENT DOCUMENTS

2013/0187537 A1* 7/2013 Hikmet ................. C09K 11/06
                                                            313/504

FOREIGN PATENT DOCUMENTS

| | | |
|---|---|---|
| EP | 2546319 A1 | 1/2013 |
| JP | 2003217857 A | 7/2003 |
| JP | 2013098458 A | 11/2016 |
| WO | WO2012042415 A1 | 4/2012 |
| WO | WO2012042434 A1 | 4/2012 |
| WO | WO2012042438 A1 | 4/2012 |
| WO | WO2013004677 A1 | 1/2013 |
| WO | WO2013166601 A1 | 11/2013 |
| WO | WO2013182968 A1 | 12/2013 |
| WO | WO 2014122549 A1 | 8/2014 |
| WO | WO2015024064 A1 | 2/2015 |

OTHER PUBLICATIONS

Veldman et al. J. Phys. Chem. A 2008, 112, 8617-8632. (Year: 2008).*
U. Selig, et al., "Similarities and Differences in the Optical Response of Perylene-Based Hetero-Bichromophores and Their Monomeric Units", ChemPhysChem, 2013, 14, pp. 1413-1422.
B.Balaban, et al., "The Role of FRET in Solar Concentrator Efficiency and Color Tunability" Journal of Luminescence, 146 (2014) pp. 256-262.

(Continued)

*Primary Examiner* — Andrew K Bohaty
(74) *Attorney, Agent, or Firm* — Akarsh P. Belagodu

(57) ABSTRACT

The invention provides a lighting device comprising a light source configured to provide light source light having a blue light component and a light converter configured to convert at least part of the light source light into converter light, wherein the light converter comprises a polymeric matrix (22) with a luminescent material, wherein the luminescent material comprises a luminescent molecule (300) comprising a first group (310) able to absorb at least part of the blue light component, and a second group (320) able to emit luminescent molecule light having a red light component, wherein the first group (310) is configured to transfer at least part of the energy acquired by the absorption of said blue light component to the second group (320) for generation of said luminescent molecule light having a red light component.

13 Claims, 11 Drawing Sheets

(56) References Cited

OTHER PUBLICATIONS

P. He, et al., "A Strong Red-Emitting Carbazole Based Europium (III) Complex Excited by Blue Light", The Royal Society of Chemistry 2010, Dalton Trans., 2010, 39, pp. 8919-8924.

A. de Bettencourt-Dias, "Introduction to Lanthanide Ion Luminescence", Dept. of Chemistry, Univ. of Nevada, USA, Published by John Wiley & Son, Ltd., 2014, pp. 1-48.

C-J Chen, et al., "Preparation of Quantum Dot/Polymer Light Conversion Films With Alleviated Förster Resonance Energy Transfer Redshift", Journal of Materials Chemistry C., Jan. 1, 2014, pp. 1-8.

D. de Martino, et al., "Straightforward Fabricaiton of Stable White LEDs by Embedding of Inorganic UV-LEDs into Bulk Polymerized Polymethyl-methacrylate Doped with Organic Dyes", Scientifics Reports, Mar. 18, 2014, pp. 1-5.

D. Liu, et al. "Fluorescence and Intramolecular Energy Transfer in Polyphenylene Dendrimers", Macromolecules, Aug. 1, 2003, pp. 5918-5925.

M. Mosca, et al., "Warm White LED Light by Frequency Down-Conversion of Mixed Yellow and Red Lumogen", Proc. of SPIE, vol. 8767, May 22, 2013, p. 87670L.

F. Fennel, et al., "Long Distance Energy Transfer in a Polymer Matrix Doped With a Perylene Dye", Physical Chemistry Chemical Physics., vol. 13, No. 8, Jan. 1, 2011, pp. 3527-3533.

J. Qu, et al., "Dendronized Perylene Diimide Emitters: Synthesie, Luminescence, and Electron and Energy Transfer Studies"., Macromolecules, vol. 37, No. 22, Nov. 1, 2004, pp. 8297-8306.

H. Ren, et al., "Synthesis and Properties of Novel Perylenebisimide-Cored Dendrimers", Dyes and Pigments, Elsevier Applied Science Publishers, vol. 91, No. 3, Apr. 7, 2011, pp. 298-303.

E. Fron, et al., "Energy Transfer Pathways in a Rylene-Based Triad", ChemPhysChem 2011, 12, pp. 595-608.

* cited by examiner

HIGHLY EFFICIENT MOLECULES SHOWING RESONANT ENERGY TRANSFER

CROSS-REFERENCE TO PRIOR APPLICATIONS

This application is the U.S. National Phase application under 35 U.S.C. § 371 of International Application No. PCT/EP2015/068959, filed on Aug. 18, 2015, which claims the benefit of European Patent Application No. 14181790.8, filed on Aug. 21, 2014. These applications are hereby incorporated by reference herein.

FIELD OF THE INVENTION

The invention relates to a lighting device comprising (a) a light source configured to generate light source light, and (b) a light converter configured to convert at least part of the light source light into visible converter light. The invention further pertains to a luminescent material that can be comprised by such light converter, as well as to such light converter.

BACKGROUND OF THE INVENTION

Phosphor-enhanced light sources are known per se and are used for substantially all kinds of light sources. Phosphor-enhanced light sources comprise a light emitter and a luminescent material. The luminescent material is arranged for converting at least part of the light emitted by the light emitter into light of a longer wavelength.

Well-known phosphor-enhanced light sources are, for example, mercury vapor discharge lamps in which the light is emitted from a discharge in which the presence of mercury vapor causes the discharge to emit ultraviolet radiation. At least a part of the ultraviolet radiation is absorbed by a luminescent material and converted into light of a longer wavelength which is subsequently emitted by the luminescent material. Such mercury vapor discharge lamp may, for example, comprise a discharge vessel in which the discharge is generated. The luminescent material is typically applied to the inner wall of the discharge vessel such that the ultraviolet radiation emitted by the discharge does not need to pass the discharge vessel but is inside the discharge vessel converted into, for example, visible light.

Alternatively, the phosphor-enhanced light source may comprise a solid-state light emitter as the light emitter. Such a solid-state light emitter may, for example, be a light emitting diode, or a laser diode, or an organic light emitting diode. The light emitted by a solid-state light emitter typically has a relatively narrow spectrum arranged around a center wavelength. The width of the spectrum may, for example, be defined by the Full Width Half Maximum (further also indicated as FWHM) of the emission peak which is a width of the emission peak measured at an intensity being half the maximum emission intensity of the light emitted by the solid-state light emitter. The FWHM of a typical emission spectrum of the solid-state light emitter is less than 30 nanometer, which is typically identified by the human eye as light of a single color.

To change the color of the light emitted by the solid-state light emitter, luminescent materials may be added to generate a phosphor-enhanced light source. The luminescent material may, for example, be applied as a layer on top of the (LED) die of the solid-state light emitter, or may, for example, be dispersed in a matrix which may be located at a distance of the solid-state light emitter, a so called "remote phosphor" arrangement. The luminescent material may also be part of a mixture of different luminescent materials, for example, each generating a different color such that the mixed light, for example, generates white light having a specific color temperature. Furthermore, luminescent materials may be added to solid-state light emitters to improve the color rendering characteristics of the solid-state light emitters, as the typical emission characteristic of the luminescent materials is a relatively broad spectrum of light.

The use of dyes in matrices is (also) known in the art. U.S. Pat. No. 6,537,679, for instance, describes a fluorescent retro reflective article comprising a polymer resin comprising poly(1,4-cyclohexanedimethanol-co-ethylene terephthalate) (PETG) and a fluorescent dye selected from the group consisting of perylene imide and perylene ester dyes, thioxanthene dyes, benzoxanthene dyes, and benzothiazine dyes. The PETG fluorescent resin matrix can be used to enhance daytime visibility of a roadway marker. Such a pavement marker comprises a base member comprising a structure of a light-transmissible fluorescent material, the structure having a top surface and a front edge surface, the base member being configured to provide an air cap beneath the structure.

P. He et al., Dalton Trans., 2010, 39, 8919-8924 describes a red-emitting carbazole based europium (iii) complex excited by blue light. It describes carbazoles including aromatic groups and a trivalent Europium ion.

SUMMARY OF THE INVENTION

In order to obtain white light with phosphor converted LEDs, e.g. blue light emitted by LEDs is partially converted to yellow/red light using a phosphor layer. As a result white light with desired colour temperature is obtained. Inorganic phosphors are widely used in such applications because of their high photo-thermal stability. Organic phosphors are attractive alternatives to be used in phosphor converted LED applications. The advantage of such systems is the freedom in tuning the luminescence spectrum by mixing various phosphors with each having typical luminescence properties and the ability to tune the luminescence properties by molecular engineering if needed. Furthermore, organic phosphors are much cheaper than inorganic phosphors. Organic phosphors are especially considered in remote phosphor applications where the phosphor is placed further away from the LED source and the temperatures and light intensity at the phosphor is relatively low to avoid excessive degradation. However, the lifetime of yellow phosphors is still rather critical.

To make red light, the use of, amongst others, F-300 (=F-305=BASF Red=Lumogen® F Red 300 (BASF)=CAS 123174-58-3) is considered. It is shows a good lifetime and quantum efficiency.

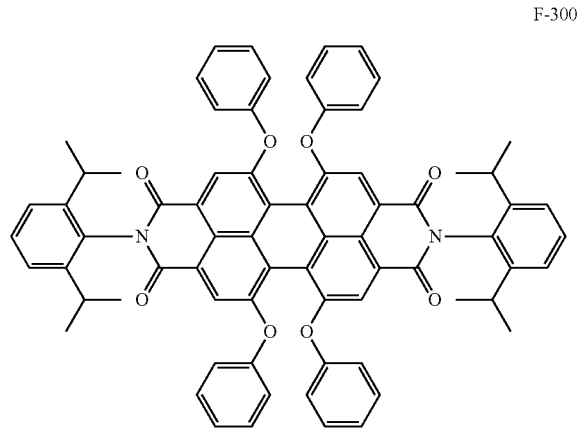 [SMILES: CC(C)c1cccc(C(C)C)c1N1C(=O)c2cc(Oc3ccccc3)c3c4c(Oc5ccccc5)cc5c6c(cc(Oc7ccccc7)c(c7c(Oc8ccccc8)cc(c2c37)C1=O)c64)C(=O)N(c1c(C(C)C)cccc1C(C)C)C5=O]

F-300

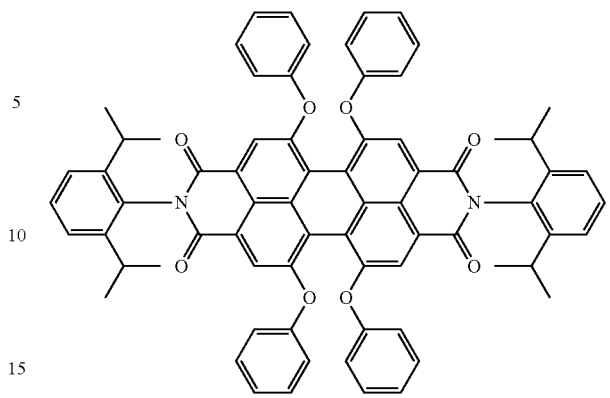

This molecule (sometimes also indicated as F-305) and alternative structures (see also below in relation to molecule I) absorb yellow light more than blue light. This means that a huge part of the yellow light generated by organic or inorganic yellow emitting dyes is converted to red light. This results in an efficiency loss due to the double light conversion (blue to yellow; yellow to red) and to inefficient use of yellow phosphors.

Hence, it is an aspect of the invention to provide an alternative (red) luminescent material, which preferably further at least partly obviates one or more of above-described drawbacks, and which may thus have a higher efficiency. It is further an aspect of the invention to provide an alternative lighting device using such (red) luminescent material, which preferably further at least partly obviates one or more of above-described drawbacks, and which may thus also have a higher efficiencies.

We suggest—amongst others—the use of molecules having yellow donor and red acceptor groups where Förster resonant energy transfer (FRET) can take place (within the molecule). These molecules should especially contain parts that strongly absorb blue (LED) light and have a low absorption in the yellow (and/or green) region to avoid or minimize absorption of the yellow light. For that reason, one or more yellow moieties should (covalently) be connected to the red emitting moiety.

Hence, in a first aspect the invention provides a lighting device comprising a light source configured to provide light source light, especially having a blue light component, and a light converter configured to convert at least part of the light source light into converter light, wherein the light converter comprises a luminescent material, especially wherein the light converter comprises a (polymeric) matrix with such luminescent material (embedded therein), wherein the luminescent material comprises a(n organic) luminescent molecule comprising a first group able to absorb at least part of the light source light, especially of a blue light component of the light source light, and a second group able to emit luminescent molecule light, especially having a red light component, wherein the first group is especially configured to transfer at least part of the energy acquired by the absorption of at least part of the light source light, especially of said blue light component, to the second group for generation of said luminescent molecule light especially having a red light component, and wherein (especially) the second group comprises a group based on:

and a derivative thereof. As further elucidated below, the invention provides in a further aspect also such luminescent material or such luminescent molecule per se.

With such molecule, advantageously blue light absorbed by the molecule may directly be converted into red light. In this way, light source configurations can be designed wherein reabsorption of green and/or yellow light may be minimized and high efficiencies can be obtained. Herein, the term "a molecule" may also relate to a plurality of molecules. Further, the term "a molecule" may also relate to a plurality of different molecules, complying with the herein indicated conditions.

Herein, the two groups are configured to provide luminescence upon excitation based on energy transfer, especially Förster resonant energy transfer. Förster resonance energy transfer (FRET) or fluorescence resonance energy transfer (FRET), or resonance energy transfer (RET) or electronic energy transfer (EET) is a mechanism describing e.g. energy transfer between two light-sensitive molecules (chromophores). A donor chromophore (luminescent molecules), initially in its electronic excited state, may transfer energy to an acceptor chromophore through nonradiative dipole-dipole coupling. Herein, the energy is especially resonated within a single molecule, not between different molecules. In the latter case (i.e. energy transfer between molecules), in general high concentrations are necessary which may disadvantageously also lead to concentration quenching. Hence, especially the first group is configured as Förster resonant energy transfer donor and the second group is configured as Förster resonant energy transfer acceptor. The disadvantages of need to use relative high concentrations of chromophores is avoided with the present invention. Further, especially two adjacent first and second groups (at the same molecule) may especially be arranged at a shortest distance from each other equal to or smaller than about 10 nm, especially equal to or smaller than about 5 nm, such as equal to or smaller than 2.5 nm. At such distances, Förster resonant energy transfer (FRET) may take place. Hence, the invention provides an organic luminescent material or organic luminescent molecule comprising at least a first group (as defined herein) and at least a second group (as defined herein), both comprised by the same organic luminescent molecule. The first group is configured to transfer at least part of the energy acquired by absorption from light to the second group, with the second group (thereupon) emitting light, especially red light. The shortest distances between a couple of an adjacent first group and second group (at the same molecule) may especially be in the range of about 5 nm or smaller, such as e.g. in the range of 0.5-5 nm.

Hence, especially the first group is configured to absorb blue light. In another aspect, the first group may be configured to absorb (also) UV light. The blue light component may optionally not only be used to excite the molecule but may also be used as component of the lighting device light, e.g. to generate white light. The phrase "light source light having a blue light component" and similar phrases indicate that the light source generates light that may consist of blue light or that may comprise blue light and optionally also other parts of the electromagnetic spectrum, especially selected from the visible part and optionally also from the UV part.

In a specific embodiment the second group comprises (a group based on) F-300 (see above) or a derivative thereof. More in general, the second group may especially comprise a molecule as defined by formula I (see below). A specific embodiment of the molecule defined by formula I is elucidated below when further explaining derivatives of the herein indicated molecules. Herein, in general the term "derivative" indicates that each free position may independently of each other include groups like a hydrogen, a hydrocarbon, a halogen, etc. (see further also below). By way of example, in the above depicted molecule F300 one may assume that each free group is a hydrogen atom. For instance, the four O-phenyl groups may each include 5 H atoms. Further, at least one of the free positions in the molecule may be used to covalently link to one or more first groups. This may be done either directly, or via a linker (see below). Further, at least one of the free positions in the molecule may be used to covalently link to the matrix (see below). Further information on derivatives is found below. The phrase "or a derivative thereof" and similar phrases indicate that such group may alternatively comprise a derivative of the indicated (drawn) group. Would however a molecule comprise a plurality of such groups, in embodiments each group may independently be selected from the specifically indicated group and derivatives thereof. Further, the phrase "or a derivative thereof" does not imply that there is one type of derivatives. Any derivative, as further elucidated, below may be included.

As indicated above, in a specific embodiment the first group comprises a group configured to absorb at least part of the blue light component and is especially able to transfer its energy to the second group to generate red light. In this way, via (non-radiative) energy transfer, such as FRET, red light may be generated without substantial loss (due to intermediate absorption and emission).

Note that such molecules may also provide e.g. embodiments wherein part of the (total number of) molecules only include the first group, and may substantially be used to convert blue light into green and/or yellow light, and another part of the molecules include the herein indicated first group and second group, and may substantially be used to convert blue light directly into red light, thereby providing luminescent material light that may be white.

In yet a further specific embodiment, the first group comprises one or more groups based on one or more of:

F084

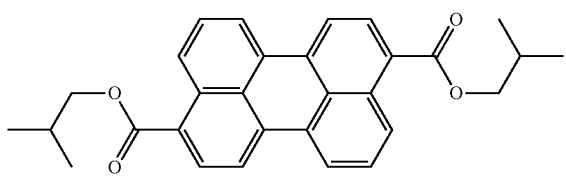

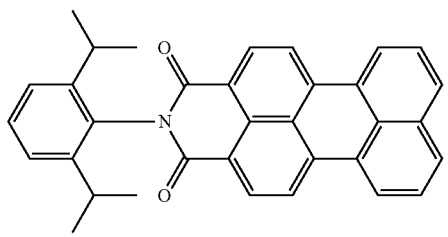
2324

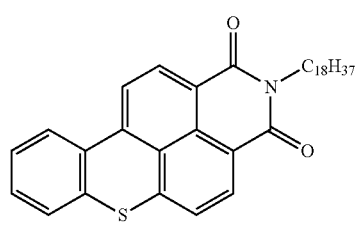
Solvent yellow

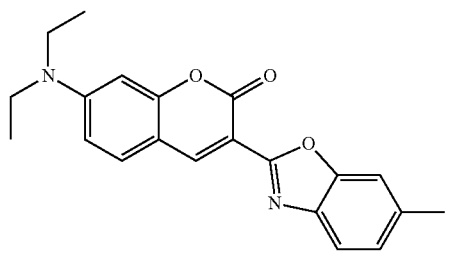
Disperse yellow

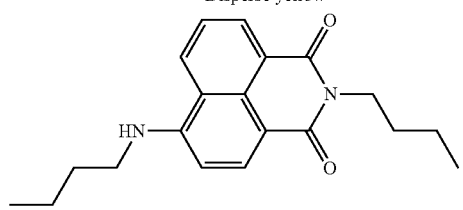
Fluorescent yellow or derivatives thereof.

Other relevant organic yellow phosphors are amongst others described in EP2645822, which is herein incorporated by reference, and may be derived from perylene, such as (the above indicated) 2324 (CAS: 165550-61-8) or F084 (CAS: 2744-50-5) or F83 (or F083) (CAS: 100443-95-6), or Solvent Yellow 98 (CAS: 12671-74-8), or disperse yellow (CAS: 34564-13-1) or fluorescent yellow 43 (CAS: 19125-99-6), etc. It appears that with these yellow groups, efficient energy transfer to the red emitting groups may be obtained. A single molecule with more than one first groups may in an embodiment comprise different first groups, such as e.g. 2324 (or a derivative thereof) and F084 (or a derivative thereof). Again, herein in general the term "derivative" indicates that each free position may independently of each other include groups like a hydrogen, a hydrocarbon, a halogen, etc. Free positions are in FIGS. 2b and 2c also indicated with "G".

By way of example, in the above depicted molecules, one may assume that each free group is a hydrogen atom. For instance, some of the ternary groups may be iso-propyl groups (i.e. each free position includes H atoms), but may also include ternary carbons with one or more longer chains and optionally also a quaternary group (when the free position on the ternary carbon is not occupied by an H atom but by a hydrocarbon).

Further, at least one of the free positions in the molecule may be used to covalently link to one or more second groups. This may be done either directly, or via a linker (see below). Further, at least one of the free positions in the molecule may be used to covalently link to the matrix (see below). Further information on derivatives is found below.

It further appears that best results in terms of quantum efficiency may be obtained when the molecule includes a bulky group, especially when the first group includes a bulky group or is arranged adjacent to such bulky group. It is assumed that thereby the distance between adjacent molecules or groups may be increased thereby reducing possible energy quenching. Hence, in a further embodiment the luminescent molecule further comprises a bulky group. The term "bulky group" may also refer to a plurality of (different) bulky groups. Especially, the bulky group comprises a ternary or quaternary carbon. Hence, especially the bulky group is covalently linked to the first group or is part of the first group.

The bulky group can be a side group of the first group (i.e. e.g. a derivative of one of the above indicate first groups) and/or it can be a side group of the second group (i.e. e.g. a derivative of one of the above indicate second groups). Alternatively or additionally, the bulky group can e.g. be at least part of a linker between the first group and the second group. Hence, in a specific embodiment the bulky group is arranged between the first group and the second group. In yet another specific embodiment, the bulky group is covalently linked to the first group.

As indicated above, linkers may especially include one or more of ternary and quaternary carbon atoms. In a specific embodiment the bulky group comprises:

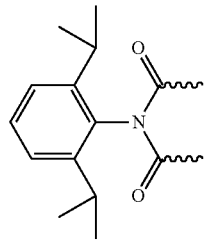

or a derivative thereof. Herein, the wiggles indicate a remaining part of a molecule, such as e.g. a cyclic group.

Further, as indicated above the bulky group may be part of the first group or part of the second group. In a specific embodiment, the first group in combination with the bulky group comprises one or more groups based on one or more of:

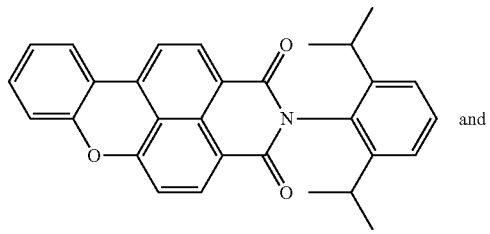

2363

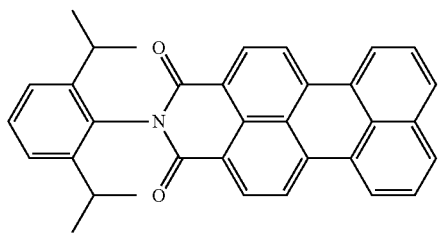

2324 and derivatives thereof. The second group, when comprising F300, by definition includes such group.

With respect to a linker between the first group and the second group, such linker will in general at least provide a (linear) chain of at least 4 chemical bonds, such as at least 4 carbon-carbon bonds, i.e. the two groups are separated by a chain of at least 4 carbon-carbon bonds. Hence, in a specific embodiment the first group and second group are separated from each other with a covalently bound chain of at least 4 chemical bonds, wherein the chain comprises one or more of C, O, N and Si atoms. The term "linker" may optionally refer to a plurality of linkers (between a first group and a second group). Optionally, within a single molecule different linkers may be applied.

As from the above given examples appear, a single molecule can include a plurality of first groups. Alternatively or additionally, a single molecule can include a plurality of second groups. Hence, in embodiments the luminescent molecule comprises one or more yellow donor groups (as first group(s)) and one or more red acceptor groups (as second group(s)). In a specific embodiment, the number of first groups in the luminescent molecule is larger than the number of second groups. This may be advantageous in view of efficiency. Especially, a single molecule includes a single second group, and one or more first groups. Specific first groups may e.g. be selected from the group consisting of F084, 2324, solvent yellow, disperse yellow, fluorescent yellow, 2363 and 2324, and derivatives thereof.

Some specific molecules appeared to be very efficient. Hence, in yet a further aspect, the invention also provides some specific embodiments of such luminescent material per se. Hence, in a further embodiment the invention provides a luminescent material comprising one or more of:

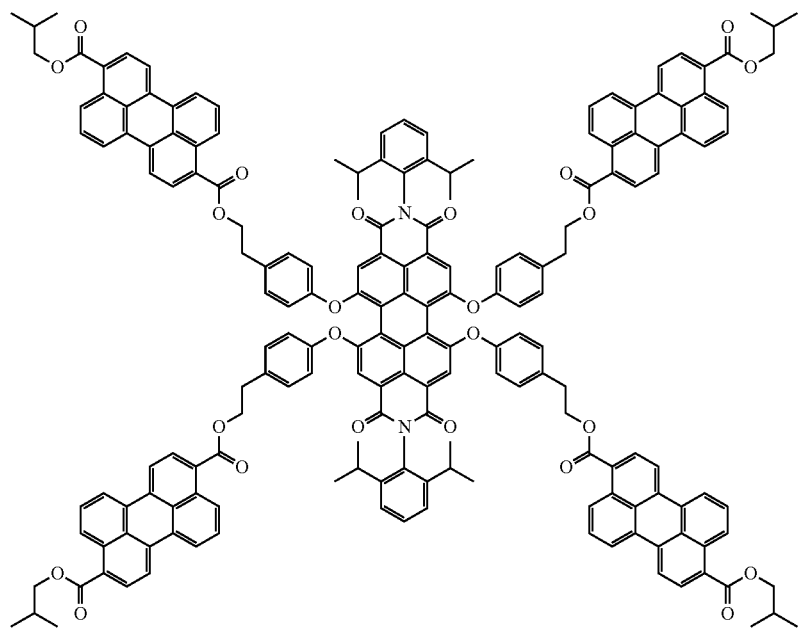
2455
and
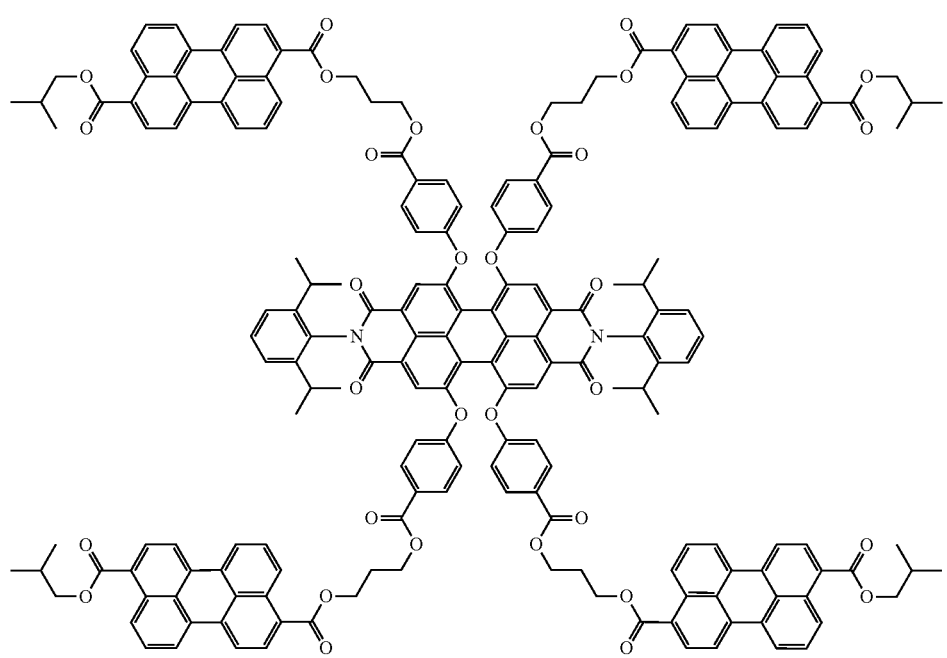
2452
and

-continued

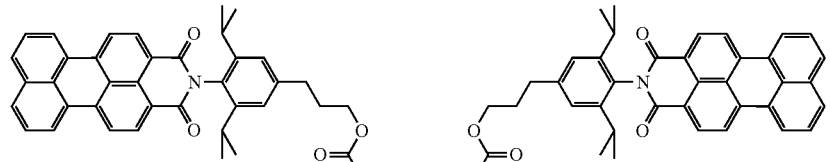

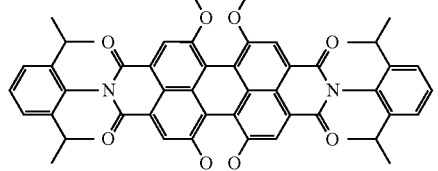

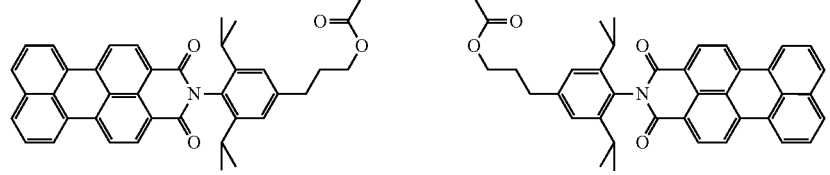

2517 and

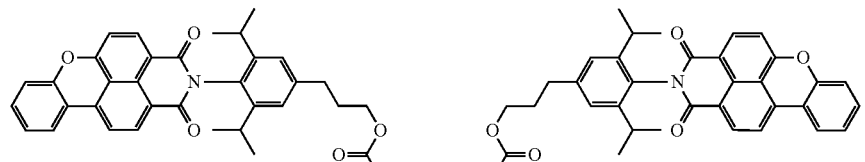

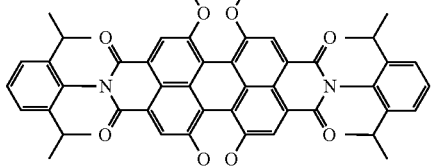

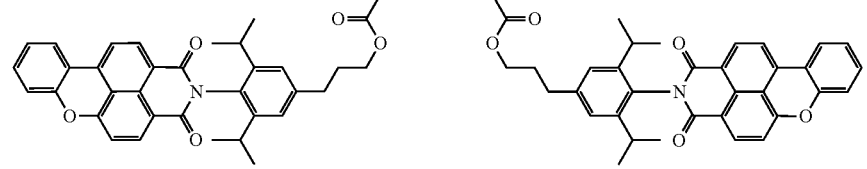

2440 and derivatives thereof.

Of course, the invention also provides the above defined lighting device wherein the luminescent molecule is selected from this group. More in general, in yet a further aspect the invention also provides a lighting device comprising a light source configured to provide light source light and a luminescent material selected from this group and configured to convert at least part of the light source light into luminescent molecule light. In yet a further aspect, the invention also provides a converter comprising a luminescent material as defined herein, especially a luminescent material comprising a luminescent molecule selected from above defined group.

As indicated above, the groups may include derivatives of the indicated molecules. Hence, e.g. one or more "free positions" do not include H but may include another group.

Derivatives are groups having at a free position e.g. a C1-C18 alkyl group, a C6-C24 aryl group, a C6-C24 heteroaryl, a halogen, or another group, instead of H. Other groups that may be possible may be selected from the group consisting of CN, $NO_2$, $CO_2$alkyl, $CO_2$Aryl, CONalkyl, CONAryl, OCOalkyl, OCOAryl, NCOalkyl, NCOAryl, etc.

For instance, such molecule may include one or more C1-C18 alkyl groups. Herein, the term "C1-C18alkyl" may especially relate to a branched C1-C18alkyl or an unbranched C1-C18alkyl. The term "C1-C18alkyl" may relate to an unsubstituted C1-C18alkyl or substituted C1-C18alky (i.e. C1-C18alkyl with one or more substituents). The term "C1-C18alkyl" may relate to a linear C1-C18alkyl or non-linear C1-C18alkyl (which may be substituted or unsubstituted). The term "non-linear" herein may refer to cyclic, like C1-C18 cyclo alkyl.

By way of example, the term "C1-C18alkyl" may relate in an embodiment to a linear heptyl group, but may in another embodiment relate to a methyl substitute cyclo hexane group, with one or more fluor substituents. C1-C18alkyl especially relates to C1-C16 alkyl, like C1-C8 alkyl, such as C1-C4 alkyl.

Examples of alkyl groups are especially methyl, ethyl, n-propyl, isopropyl, n-butyl, isobutyl, sec-butyl, tert-butyl, n-pentyl, neo-pentyl, n-hexyl, n-heptyl, n-octyl, n-nonyl, n-decyl, n-undecyl, n-dodecyl, etc. Examples of cyclo alkyl groups are e.g. cyclopentyl, cyclohexyl, cycloheptyl, cyclooctyl, etc.

Optionally, the carbon chains of the C1-C18alkyl may be interrupted by one or more groups which are independently selected from —O— and —S—. Hence, in an embodiment the term C1-C18 alkyl may also relate to an ether or in a variant a polyether. Therefore, in a specific embodiment C1-C18alkyl may also refer to C1-C18alkyl comprising one or more ether groups, such as C—$H_{2n+1}O_m$, with n being an integer from 1 to 18, such as 1-16, and with $0 \leq m \leq n/2$.

Substituents that may be applied may be selected from fluorine, chlorine, hydroxyl, cyano, acyl, COOH, carboxylate, alkylcarbonyloxy, carbamoyl, alkylaminocarbonyl, (dialkylamino)carbonyl, $SO_3H$, sulfonate, sulfoamino, sulfamide, sulfamoyl, and amidino.

In general, the substituents will be limited to 1-6 substituents, like 1-4 substituents. In a specific embodiment, the C1-C18 alkyl is substituted with one or more fluorine atoms. For instance, in an embodiment C1-C18 alkyl especially relates to $C_nH_{2n+1-m}F_m$ with n being an integer from 1 to 18, such as 1-16, and with $0 \leq m \leq 2n+1$. Hence, the term "alkyl" and similar terms, may also relate to a substituted alkyl, such as an alkyl that is fluorinated with one or more fluor substituents.

For instance, such molecule may include one or more C6-C24 aryl groups. Herein, the term "C6-C24 aryl" may especially refer to a mono cyclic aromatic aryl group or to a polycyclic aromatic aryl group. The term "C6-C24 aryl" may relate to an unsubstituted C6-C24 aryl or to a substituted C6-C24 aryl (i.e. C6-C24aryl with one or more substituents). C6-C24 aryl especially relates to C6-C16 aryl, like C6-C10 aryl. The C6-C24 aryl may in addition to at least one aryl group, also comprise one or more non-conjugated cyclic groups.

Examples of aryl groups are phenyl, naphthyl, indenyl, fluorenyl, anthracenyl, phenanthrenyl, naphthacenyl, etc. In case the C6-C24 aryl comprises one or more aromatic groups and one or more alkyl groups, like methyl phenyl (C7), or ethyl phenyl (C8), the alkyl groups may especially be linear alkyl groups. Also these alkyl groups may independently comprise one or more substituents. Further, also these alkyl groups may be interrupted by one or more groups which are independently selected from —O— and —S—. Hence, in an embodiment such alkyl group may also relate to an ether or in a variant a polyether.

Substituents that may be applied may be selected from fluorine, chlorine, hydroxyl, cyano, acyl, COOH, carboxylate, alkylcarbonyloxy, carbamoyl, alkylaminocarbonyl, (dialkylamino)carbonyl, $SO_3H$, sulfonate, sulfoamino, sulfamide, sulfamoyl, and amidino. In general, the substituents will be limited to 1-6 substituents, like 1-4 substituents. In a specific embodiment, the C6-C24 aryl is substituted with one or more fluorine atoms.

For instance, such molecule may include one or more C6-C24 heteroaryl groups. Herein, the term "C6-C24 heteroaryl" may especially refer to heteroaromatic, mono- or polycyclic groups. The term "C6-C24 heteroaryl" may relate to an unsubstituted C6-C24 heteroaryl or to a substituted C6-C24 heteroaryl (i.e. C6-C24heteroaryl with one or more substituents). C6-C24 heteroaryl especially relates to C6-C16 heteroaryl, like C6-C10 heteroaryl The C6-C24 heteroary may in addition to at least one heteroaryl group, also comprise one or more non-conjugated cyclic groups.

Examples of C6-C24heteroaryls are e.g. 2,5-indenylene, 2,6-indenylene, pyrazinylene, pyridinylene, pyrimidinylene, 2,4-thiophenylene, 2,5-thiophenylene, 1,3,4-thiadiazol-2,5-ylene, 1,3-thiazol-2,4-ylene, 1,3-thiazol-2,5-ylene, 1,3-oxazol-2,4-ylene, 1,3-oxazol-2,5-ylene, 1,3,4-oxadiazol-2,5-ylene, etc. In case the C6-C24heteroaryl comprises one or more hetero aromatic groups and one or more alkyl groups, the alkyl groups may especially be linear alkyl groups. Also these alkyl groups may independently comprise one or more substituents. Further, also these alkyl groups may be interrupted by one or more groups which are independently selected from —O— and —S—. Hence, in an embodiment such alkyl group may also relate to an ether or in a variant a polyether.

Substituents that may be applied may especially be selected from fluorine, chlorine, hydroxyl, cyano, acyl, COOH, carboxylate, alkylcarbonyloxy, carbamoyl, alkylaminocarbonyl, (dialkylamino)carbonyl, $SO_3H$, sulfonate, sulfoamino, sulfamide, sulfamoyl, and amidino. In general, the substituents will be limited to 1-6 substituents, like 1-4 substituents. In a specific embodiment, the C6-C24heteroaryl is substituted with one or more fluorine atoms.

Further, such molecule may include a fluorine, chlorine, hydroxyl, cyano, acyl, COOH, carboxylate, alkylcarbonyloxy, carbamoyl, alkylaminocarbonyl, (dialkylamino)carbonyl, $SO_3H$, sulfonate, sulfoamino, sulfamide, sulfamoyl, and amidino, etc. Additionally or alternatively, such molecule may include a CN, $NO_2$, $CO_2$alkyl, $CO_2$Aryl, CONalkyl, CONAryl, OCOalkyl, OCOAryl, NCOalkyl, NCOAryl, etc.

Halogens herein are especially fluorine, chlorine, even more especially fluorine. Especially, when one or more halogens are present, the one or more halogens comprise (only) fluorine.

The phrase "independently selected from" may indicate that any of the indicated species may be chosen, independent of the other choices.

Having explained some of the possible options for derivation, now a molecule that can be used as second group is used to further explain derivation. F300 belongs to a more general class of formula I molecules:

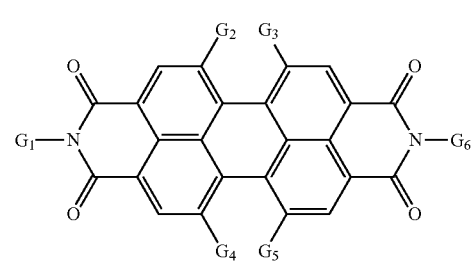

I

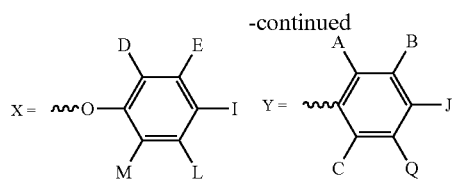

in which:
  G$_1$ and G$_6$ independently comprise a group selected from a linear alkyl, a branched alkyl, an oxygen-containing alkyl, a cycloalkyl, a naphtyl, and Y;
    wherein each of A, B, C, J and Q independently comprise a group selected from hydrogen, fluorine, chlorine, isopropyl, t-butyl, methoxy, an alkyl with up to 16 carbon atoms, and an oxygen containing alkyl with up to 16 carbon atoms;
  G$_2$, G$_3$, G$_4$ and G$_5$ independently comprise a group selected from hydrogen, fluorine, chorine, isopropyl, t-butyl, methoxy, alkyl with up to 16 carbon atoms, and oxygen-containing alkyl with up to 16 carbon atoms, and X;
    wherein each of D, E, I, L and M independently comprise a group selected from hydrogen, fluorine, chlorine, isopropyl, t-butyl, methoxy, alkyl with up to 16 carbon atoms, and an oxygen-containing alkyl with up to 16 carbon atoms;
and in which
  at least two selected from G2, G3, G4, and G5 at least comprise X, wherein independently at least one of D, E, I, L and M of at least two of said at least two selected from G2, G3, G4, and G5 comprise a group selected from fluorine and chlorine, especially fluorine.

Especially, at least two of said at least two selected from G2, G3, G4, and G5 comprise two or more groups selected from fluorine and chlorine, especially fluorine. Desired optical properties may especially be obtained when all G2-G5 at least comprise X (and at least two, especially all four, comprise a fluorine substituent). Hence, in an embodiment G2-G5 are each independently X. The linear alkyl, branched alkyl, oxygen containing alkyl (see also below), cycloalkyl, and the naphtyl, as defined above for especially G1 and G6, may especially comprise up to 44 carbon atoms. The alkyl (or naphtyl) may also be substituted with fluorine. In an embodiment, G1 and G6 are each independently C—H$_{2+1-m}$F$_m$ with n≤44, and m≤2n+1. Other substituents are not excluded. Especially, the alkyl comprises up to 20, such as up to 10, like up to 8 carbon atoms. The oxygen containing alkyl, with especially up to 44 carbon atoms, as defined above for especially G1 and G6, may in an embodiment especially relate to C$_n$H$_{2n+1}$O$_m$, with n being an integer from 1 to 44 and m<n/2. The oxygen containing alkyl, with especially up to 44 carbon atoms, may also be substituted with fluorine. Other substituents are not excluded. The oxygen containing alkyl may be linear, branched, or cyclic, or may be a combination of two or more thereof. The oxygen containing alkyl especially comprises an alcohol or an ether, such as an oligo ethylene oxide. Especially, n is up to 20, such as up to 10, like up to 8. G1 and G6 may be the same or may be different (see also below). The alkyl with up to 16 carbon atoms, as defined above for A, B, C, J, Q, G2, G3, G4 and G5, D, E, I, L and M, especially relate to C$_n$H$_{2n+1}$, with n being an integer from 1 to 16. The alkyl may be linear, branched, or cyclic, or may be a combination of two or more thereof. The alkyl with up to 16 carbon atoms may also be substituted with fluorine (see below). Other substituents are not excluded. Especially, the alkyl comprises up to 10, such as up to 8 carbon atoms. The oxygen containing alkyl with up to 16 carbon atoms, as defined above for A, B, C, J, Q, G2, G3, G4 and G5, D, E, I, L and M, especially relates to C$_n$H$_{2n+1}$O$_m$, with n being an integer from 1 to 16 and with m≤n/2. The alkyl may be linear, branched, or cyclic, or may be a combination of two or more thereof. The oxygen containing alkyl with up to 16 carbon atoms may also be substituted with fluorine (see below). Other substituents are not excluded. Especially, n is up to 10, such as up to 8. Hence, in an embodiment, the alkyl with up to 16 carbon atoms may at least partially be substituted with fluorine, and may in an embodiment especially relate to C$_n$H$_{2n+1-m}$F$_m$ with n being an integer from 1 to 16 and with m≤2n+1. The fluorine substituted alkyl may be linear, branched, or cyclic, or may be a combination of two or more thereof. Other substituents are not excluded. Especially, n is up to 10, such as up to 8. A, B, C, J, Q may independently be chosen. G2, G3, G4 and G5 may independently be chosen. D, E, I, L and M may independently be chosen.

In case of F300, G1 and G6 comprise specific Y-groups and G2, G3, G4, and G5 comprise specific X groups. An example of a derivative of F300 is compound 2409 (see below).

The above teaching applies to amongst others the first group and the second group, and thus also to the resulting molecule. For instance, assuming the specific molecules 2455, 2452, 2517 and 2440, derivatives thereof may e.g. be such molecules wherein one or more at one or more isopropyl positions tert-butyls are arranged, or wherein a yellow group includes a chlorine substituent or a nitril substituent (see e.g. F083), etc. By way of example, F083 which might be the basis of a first group is depicted below:

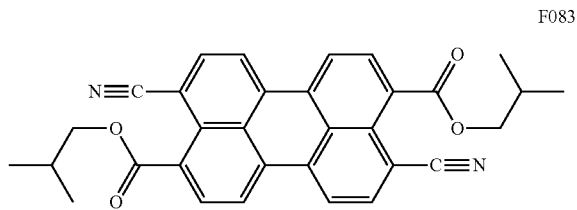 [SMILES: CC(C)COC(=O)c1ccc2c3ccc(C#N)c4c(C(=O)OCC(C)C)ccc(c5ccc(C#N)c1c52)c43]

F083

The term "luminescent material" may especially refer to an organic material that has luminescent properties (i.e. can emit light upon excitation (by one or more of UV and blue light)). The luminescent material may be applied in the lighting device as defined herein. Such lighting device may for instance comprise a TLED (tube with LED(s) within the tube, such as a T8 tube), which is a kind of retrofit lamp. The luminescent material may also be applied in a light bulb with LED(s) within the bulb, which is a kind of retrofit incandescent lamp. In both cases, the luminescent material may be applied remote, such as on the upstream face of the transmissive envelope (i.e. the inner face of the transmissive envelope. The lighting device may be designed as a luminaire. Hence, a luminaire is a specific embodiment of the lighting device as defined herein.

Optionally, the matrix may be used as transmissive envelope of a lighting device; in other words: the transmissive envelope substantially consists of the matrix.

The term light converter may refer to a system that is configured to convert light from a first wavelength into light of a second wavelength. Especially, UV and/or blue light (excitation wavelength) may be (at least partially) converted into visible light (of higher wavelength than the excitation wavelength). Another term for "light converter" is "wavelength converter". The light converter may be in the form of for instance particles, flakes, a film, a plate, etc. In a specific embodiment, the term light converter may include a self-supporting layer. Hence, in an embodiment, the light converter is selected from the group consisting of a coating, a self-supporting layer, and a plate; which light converter is thus especially solid at room temperature, especially even up to 100° C., especially even up to 150° C., more especially even up to 200° C. The light converter may be flexible or may be rigid. Further, the light converter may be flat or curved (in one or two dimensions). Further, optionally the light converter may comprise outcoupling structures at at least part of the external surface of the light converter. The light converter may comprise one or more parts, like layers on top of each other. Such parts may comprise different luminescent materials or luminescent materials in different concentration. However, at least part of the light converter comprises the (red) luminescent material.

The matrix may especially comprise a matrix material and the above indicated materials such as the luminescent material, and optionally a second luminescent material, etc. The luminescent material(s) and optionally other luminescent materials may in an embodiment especially be evenly distributed throughout the matrix. However, the light converter may also comprise two or more segments, wherein two or more segments have different compositions at least with respect to the luminescent material(s), e.g. with respect to type and/or concentration of the luminescent material(s).

The luminescent material(s) (i.e. at least the luminescent material as defined herein, but optionally also including one or more second luminescent materials), may in an embodiment molecularly be distributed through the matrix. Alternatively or additionally, the luminescent material(s) are available as particles, optionally having a coating. In the latter embodiment, coated particles may be embedded in the matrix. The coating may especially be applied to seal such particle from $H_2O$ and/or $O_2$.

Especially, the matrix material is transmissive for light having a wavelength selected from the range of 380-750 nm. For instance, the matrix material may be transmissive for blue, and/or green, and/or red light. Especially, the matrix material is transmissive for at least the entire range of 420-680 nm. Especially, the matrix material may have a light transmission in the range of 50-100%, especially in the range of 70-100%, for light generated by the light source of the lighting unit (see also below) and having a wavelength selected from the visible wavelength range. In this way, the matrix material is transmissive for visible light from the lighting unit. The transmission or light permeability can be determined by providing light at a specific wavelength with a first intensity to the material and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The light converter may be transparent or translucent, but may especially be transparent. Especially, the light converter is substantially transparent and/or does not substantially scatter light. When the light converter is transparent, light of the light source may not entirely be absorbed by the light converter. Especially when using blue light, this may be of interest, as the blue light may be used to excite the light luminescent materials and may be used to provide a blue component (in white light).

The matrix (material) may comprises one or more materials selected from the group consisting of a transmissive organic material support, such as selected from the group consisting of PE (polyethylene), PP (polypropylene), PEN (polyethylene napthalate), PC (polycarbonate), polymethylacrylate (PMA), polymethylmethacrylate (PMMA) (Plexiglas or Perspex), cellulose acetate butyrate (CAB), silicone, polyvinylchloride (PVC), polyethylene terephthalate (PET), including in an embodiment (PETG) (glycol modified polyethylene terephthalate), PDMS (polydimethylsiloxane), and COC (cyclo olefin copolymer). Especially, the matrix may comprise an aromatic polyester, or a copolymer thereof, such as e.g. polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN); especially, the matrix may comprise polyethylene terephthalate (PET). Hence, the matrix is especially a polymeric matrix.

However, in another embodiment the matrix (material) may comprise an inorganic material. Preferred inorganic materials or hybrid materials are selected from the group consisting of glasses, (fused) quartz, transmissive ceramic materials, and silicones. Also hybrid materials, comprising both inorganic and organic parts may be applied.

Especially preferred are PMMA, PET, transparent PC, or glass as material for the matrix (material). Even more especially, the matrix comprises polyethylene terephthalate (PET) as this matrix seems to give the best optical properties compared to other matrices with the same luminescent materials(s). The luminescent material degrades (under influence of light source irradiation) slowest in PET. Herein, the term "PET" may also refer to PET-G (Polyethylene Terephtalate Glycol-modified or optional other modifications. Hence, the matrix especially comprises a (polymeric) material that is especially transmissive for at least part of light generated by the luminescent material.

The light converter may especially be made by combining the luminescent material(s) and optionally other ingredients and one or more precursors of the matrix, followed by a synthesis of the matrix. For instance, in case of polymeric matrix materials this may be done by using monomeric precursors of the polymer and polymerizing the monomeric precursors, like by step-growth polymerization, or by radical chain polymerization, etc., in the presence of the luminescent material(s) and optionally other ingredients, to provide the polymeric matrix. Another option may be using as starting material(s) molecules, especially polymers, that are curable, and curing these molecules, especially polymers, in the presence of the luminescent material(s) and optionally other ingredients, to provide the matrix. Hence, especially the matrix is a polymeric matrix.

The organic phosphor may be embedded in such material. The term "embedded" may e.g. refer to the inclusion of the material as particles but may also refer to a molecular dispersion of the organic phosphors in the (polymeric) matrix material. As indicated herein, the (polymeric) matrix is especially a solid matrix.

Alternatively or additionally, the one or more second luminescent materials may be available in a coating on the luminescent light converter. Alternatively or additionally, the one or more second luminescent materials may be arranged within the lighting device separate from the light converter. Especially, the one or more second luminescent materials comprise a red emitting phosphor. The term "second luminescent material" especially refers to an inorganic material that has luminescent properties (i.e. can emit light upon excitation (by one or more of UV and blue light)). The second luminescent material may especially be configured to emit at least in the red, though other wavelengths are not excluded, like (also) in the yellow, green, etc. The term "second luminescent material" especially refers to an inorganic material that has luminescent properties (i.e. can emit light upon excitation (by one or more of UV and blue light)). However, the second luminescent material may in other embodiments comprise an organic luminescent material (different from the organic luminescent material(s) as defined herein).

Hence, the second luminescent material as indicated above may especially be configured to provide red light (and optionally other light). Hence, the second luminescent material may especially be configured to convert at least part of the light of the light source into at least red light. The second luminescent material, and especially a second luminescent material configured to provide red light, may be comprised by the light converter, especially the matrix, but may also be outside the light converter, such as a coating on the light converter.

The second luminescent material may comprise quantum dots (QDs). Amongst other narrow band emitters quantum dots are highly suitable for this purpose. Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. This means that by using quantum dots any spectrum can be obtained as they are narrow band emitters.

Additionally or alternatively, the second luminescent material may also comprise other luminescent materials, such as one or more of selected from the group consisting of divalent europium containing nitride luminescent material or a divalent europium containing oxonitride luminescent material, such as one or more materials selected from the group consisting of $(Ba,Sr,Ca)S:Eu$, $(Mg,Sr,Ca)AlSiN_3:Eu$ and $(Ba,Sr,Ca)_2Si_5N_8:Eu$. The second luminescent material may also comprise one or more luminescent materials selected from the group consisting of a trivalent cerium containing garnet (see above) and a trivalent cerium containing oxonitride. The oxonitride materials are in the art often also indicated as oxynitride materials. Hence, in an embodiment the second luminescent material is configured to provide at least red light, the (organic) luminescent material comprising the two (or more) organic phosphors as defined herein is configured to provide at least green and/or yellow light, and especially the light source is configured to provide blue light. As indicated the second luminescent material comprises a quantum dot based luminescent material. Hence, in an embodiment the light source is configured to provide blue light, the lighting device further comprises a second luminescent material configured to provide red light, wherein the second luminescent material comprises a luminescent material selected from the group consisting of $(Ba,Sr,Ca)S:Eu$, $(Mg,Sr,Ca)AlSiN_3:Eu$ and $(Ba,Sr,Ca)_2Si_5N_8:Eu$ (and optionally a quantum dot based luminescent material (see also above))(and optionally an organic red luminescent (see also below)). Alternatively or additionally, the second luminescent material comprises a quantum dot based luminescent material. The second luminescent material may be embedded in the matrix and/or may be applied as coating to the matrix. Additionally or alternatively, the second luminescent material may also be arranged elsewhere in the lighting device, but may still be configured to convert at least part of the light source light into visible light, that may optionally complement the light of the organic luminescent material. Hence, in a specific embodiment the lighting device further comprises a quantum dot based luminescent material embedded in the matrix.

The term "second luminescent material" may thus also relate to a plurality of different second luminescent materials. The second luminescent material may be comprised by the light converter, such as embedded in the matrix, like especially the organic luminescent material, or may be outside the light converter, such as a layer on the light converter, or may be elsewhere in the lighting device. Combinations of two or more of such configurations are also possible. Hence, in an embodiment the second luminescent material, such as the quantum dot based luminescent material, is embedded in the matrix.

Hence, in an embodiment the lighting device further includes a second luminescent material configured to provide second luminescent material light having one or more of green light component and a yellow light component (e.g. one or more of the above indicated molecules that can be used as first group, and derivatives thereof). In this way, e.g. white lighting device light may be provided.

As indicated above, the lighting device comprises (a) a light source configured to generate light source light, and (b) a light converter configured to convert at least part of the light source light into visible converter light.

The light converter, or especially the luminescent material, is configured to convert at least part of the light source light. In order words, one may say that the light source is radiationally coupled to the light converter, especially the luminescent material. When the light source comprises a substantially UV light emitting light source, the luminescent material may be configured to convert substantially all light source light that impinges on the luminescent material. In case the light source is configure to generate blue light, the luminescent material may partly convert the light source light. Dependent upon the configuration, a part of the remaining light source light may be transmitted through a layer comprising the luminescent material. Here, the term may relate to one or more of the organic luminescent material and the second luminescent material.

The term light source may in principle relate to any light source known in the art, but may especially refers to a LED-based light source, herein further indicated as LED. The description below will—for the sake of understanding—only addresses LED-based light sources. The light source is configured to provide UV and/or blue light. In a preferred embodiment, the light emitting diode is configured to generate LED light with a blue light component. In other words, the light source comprises a blue LED. Hence, in an embodiment, the light source is configured to generate blue light. Especially, the LED is a solid state LED. The term "light source" especially relates to an electrical light source, such as a solid state light source, like a LED or solid state laser.

Preferably, the light source is a light source that during operation emits at least light at a wavelength selected from the range of 200-490 nm, especially a light source that during operation emits at least light at wavelength selected from the range of 400-490 nm, even more especially in the range of 440-490 nm. This light may partially be used by the luminescent material(s) (see below). In a specific embodiment, the light source comprises a solid state LED light source (such as a LED or laser diode). The term "light source" may also relate to a plurality of light sources, such as 2-20 (solid state) LED light sources. Hence, the term LED may also refer to a plurality of LEDs. Hence, in a specific embodiment, the light source is configured to generate blue light. In a further embodiment, the lighting device might be applied as back lighting unit in an LCD application. Hence, the invention provides in a further aspect a liquid crystal display device comprising a back lighting unit, wherein the back lighting unit comprises one or more lighting devices as defined herein.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

In an embodiment, the light source may also provide light source light having a correlated color temperature (CCT) between about 5000 and 20000 K, e.g. direct phosphor converted LEDs (blue light emitting diode with thin layer of phosphor for e.g. obtaining of 10000 K). Hence, in a specific embodiment the light source is configured to provide light source light with a correlated color temperature in the range of 5000-20000 K, even more especially in the range of 6000-20000 K, such as 8000-20000 K. An advantage of the relative high color temperature may be that there may be a relative high blue light component in the light source light.

The lighting device comprises at least the light converter comprising the (FRET based) organic luminescent material as defined herein. Other (further) luminescent materials, may also be present. The one or more second luminescent materials may each individually be comprised by the matrix but may also be provided as coating or layer on the matrix, or may be arranged elsewhere in the lighting device. The lighting device may especially be configured to be able to provide white light. Optionally, the lighting device is configured to provide colored light or is configured to be able to provide color light and white light, depending upon how the lighting device is controlled. Preferentially, the phosphor(s) (luminescent material(s), such as especially the organic luminescent materials described herein) are in the remote phosphor configuration which may lead to a total increase in the system efficacy. This configuration is most suitable in low power low operating temperature applications such as TLED (tube LED configuration, e.g. LEDs implement in a T8 tube (known in the art of fluorescent lighting) or other tubular configurations). However, other type of applications, such as directly on the solid state light source die may also be possible.

In a further aspect, the invention also provides a light converter per se. In a further aspect, the invention also provides a light converter comprising a matrix containing the luminescent material and optionally a second (organic) luminescent material Hence, in yet a further aspect the invention also provides a light converter comprising a matrix containing the luminescent material comprising a combination of two (organic) phosphors, of which especially at least one comprises the herein described organic luminescent material. As will be elucidated below, such matrix may also comprise one or more second luminescent materials, like quantum dot based materials and/or nitride based materials, and/or other luminescent materials, etc., that may especially luminesce in the red.

In yet a further aspect, the invention also provides the (organic) luminescent material per se. In yet another aspect, the invention also provides the organic luminescent molecule per se. The luminescent material comprises said organic luminescent molecule. In an embodiment, the luminescent material essentially consists of the organic luminescent molecule as indicated above herein (wherein, as indicated above, the term "organic luminescent molecule" may also refer to a plurality of different organic luminescent molecules as described herein).

The terms "upstream" and "downstream" relate to an arrangement of items or features relative to the propagation of the light from a light generating means (here the especially the first light source), wherein relative to a first position within a beam of light from the light generating means, a second position in the beam of light closer to the light generating means is "upstream", and a third position within the beam of light further away from the light generating means is "downstream".

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

As indicated above, the lighting unit may be used as backlighting unit in an LCD display device. Hence, the invention provides also a LCD display device comprising the lighting unit as defined herein, configured as backlighting unit. The invention also provides in a further aspect a liquid crystal display device comprising a back lighting unit, wherein the back lighting unit comprises one or more lighting devices as defined herein.

Preferably, the light source is a light source that during operation emits (light source light) at least light at a wavelength selected from the range of 200-490 nm, especially a light source that during operation emits at least light at wavelength selected from the range of 400-490 nm, even more especially in the range of 440-490 nm. This light may partially be used by the wavelength converter nanoparticles (see further also below). Hence, in a specific embodiment, the light source is configured to generate blue light.

In a specific embodiment, the light source comprises a solid state LED light source (such as a LED or laser diode).

The term "light source" may also relate to a plurality of light sources, such as 2-20 (solid state) LED light sources. Hence, the term LED may also refer to a plurality of LEDs.

The term white light herein, is known to the person skilled in the art. It especially relates to light having a correlated color temperature (CCT) between about 2000 and 20000 K, especially 2700-20000 K, for general lighting especially in the range of about 2700 K and 6500 K, and for backlighting purposes especially in the range of about 7000 K and 20000 K, and especially within about 15 SDCM (standard deviation of color matching) from the BBL (black body locus), especially within about 10 SDCM from the BBL, even more especially within about 5 SDCM from the BBL.

The terms "violet light" or "violet emission" especially relates to light having a wavelength in the range of about 380-440 nm. The terms "blue light" or "blue emission" especially relates to light having a wavelength in the range of about 440-490 nm (including some violet and cyan hues).

The terms "green light" or "green emission" especially relate to light having a wavelength in the range of about 490-560 nm. The terms "yellow light" or "yellow emission" especially relate to light having a wavelength in the range of about 540-570 nm. The terms "orange light" or "orange emission" especially relate to light having a wavelength in the range of about 570-600. The terms "red light" or "red emission" especially relate to light having a wavelength in the range of about 600-750 nm. The term "pink light" or "pink emission" refers to light having a blue and a red component. The terms "visible", "visible light" or "visible emission" refer to light having a wavelength in the range of about 380-750 nm.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 1a-1h and 3a are not necessarily to scale.

DETAILED DESCRIPTION OF THE EMBODIMENTS

Figure 1A:
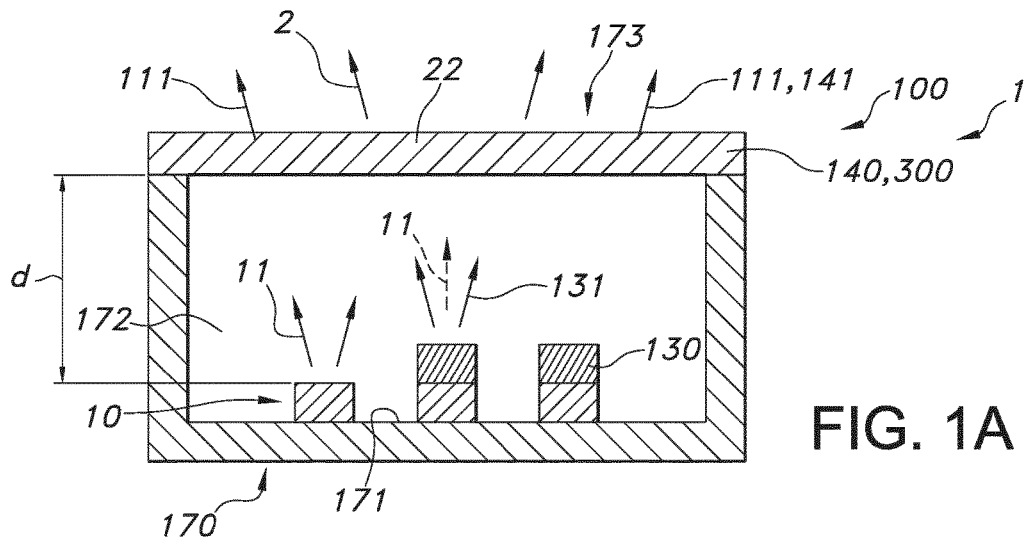
FIGS. 1a-1h schematically depict some embodiments of the lighting device; these drawings are not necessarily on scale.

FIG. 1a schematically depicts a lighting device 1 with a light converter 100, which in this embodiment at least comprises the luminescent material 140 which comprises the luminescent molecule 300 as defined herein. The luminescent material 140 is in this embodiment embedded in a (polymeric) matrix, such as PET, but may optionally also be applied as layer or coating. As can be seen, a remote version is shown, with a non-zero distance d between the luminescent material (in the light converter 100) and the light source(s), indicated with reference(s) 10. The lighting device 1 comprises one or more light sources 10 which are configured to provide light source light 11, especially blue and/or UV light. The lighting device 1 may comprise a plurality of such light sources. When lighting device light, indicated with reference 2, of a white nature is desired, it may be necessary to us an RGB concept, wherein the red color, or at least part thereof, is provided by the red luminescent material 140, and the green and/or yellow, and optionally blue light, are provided by one or more of the light source and a combination of the light source and another luminescent material, especially a second luminescent material. The optional second luminescent material is indicated with reference 130, and provides second luminescent material light 131.

The luminescent material 140 according to formula I provides upon excitation by the light source light 11 and/or by emission of one or more other luminescent materials, such as e.g. the second luminescent material light 131, luminescent material light 141. Here, the light converter 100 is remote from the light source 10, and the luminescent material, which is embedded in the light converter 100, is thus also remote. The optional second luminescent material 130 can also be arranged remote, see below, but is by way of example close to the light source 10, such as in a dome and/or as layer on the LED die.

Just by way of example, one light source has been depicted without the second luminescent material 130. However, in another embodiment, all light sources 10 may be configured with at least second luminescent material 130. Also, by way of example three light sources 10 have been depicted. However, more or less than three light sources may be applied. Note that the light source 10 may provide blue and/or UV light. The second luminescent material 130 may especially, upon excitation (by said light of the light source 10) provide yellow and/or green light. Optionally, the second luminescent material 130 may also provide red light.

FIG. 1a, and other figures, schematically depict a device with a light chamber 170, with an enclosure 171, at least partly enclosing a cavity 172, which has a transmissive part 173. In an embodiment, the transmissive part 173 comprises the light converter 100, or may especially consist of the light converter 100. The surface of the non-transmissive part of the enclosure is indicated with reference 171. At least part of the surface 171 may comprise a reflector, such as a reflective coating.

The light converter 100 provides upon excitation light converter light 111, which at least comprises luminescent material light 141 but may optionally comprise other luminescence light as well (see below). The lighting device light, indicated with reference 2, at least comprises light converter light 111/luminescent material light 141, but may optionally comprise one or more of the light source light 11, second luminescent material light 131, and light of other luminescent materials (not depicted).

Figure 1B:
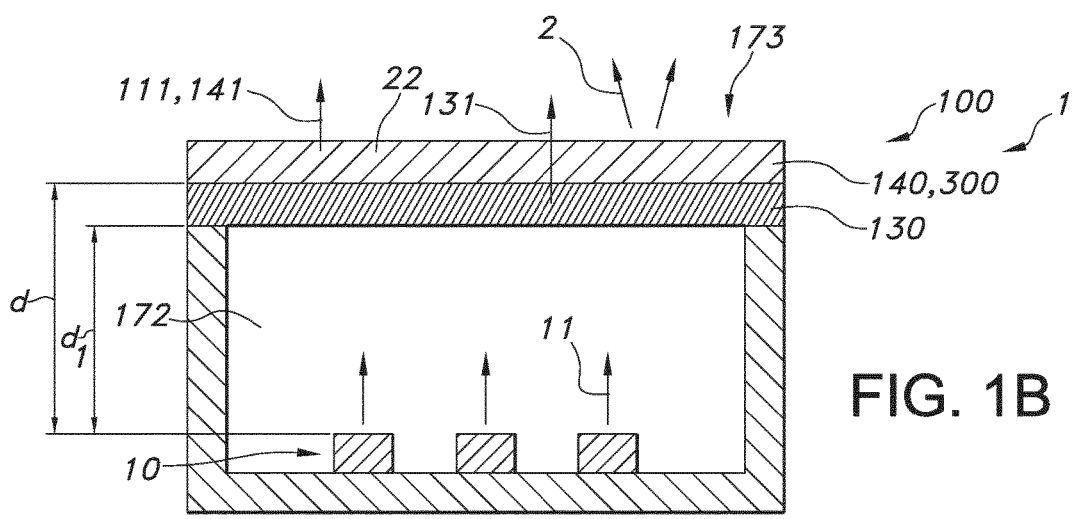

FIG. 1b schematically depicts an embodiment wherein the light converter 100 may comprise an upstream layer with second luminescent material 130. Optionally, this may be a light converter comprising two layers comprising the same matrix, but comprising different luminescent materials. The distance of the layer with second luminescent material 130 to the light source is indicated with dl. This distance is in this embodiment non-zero, in contrast to the embodiment schematically depicted in FIG. 1a.

Figure 1C:
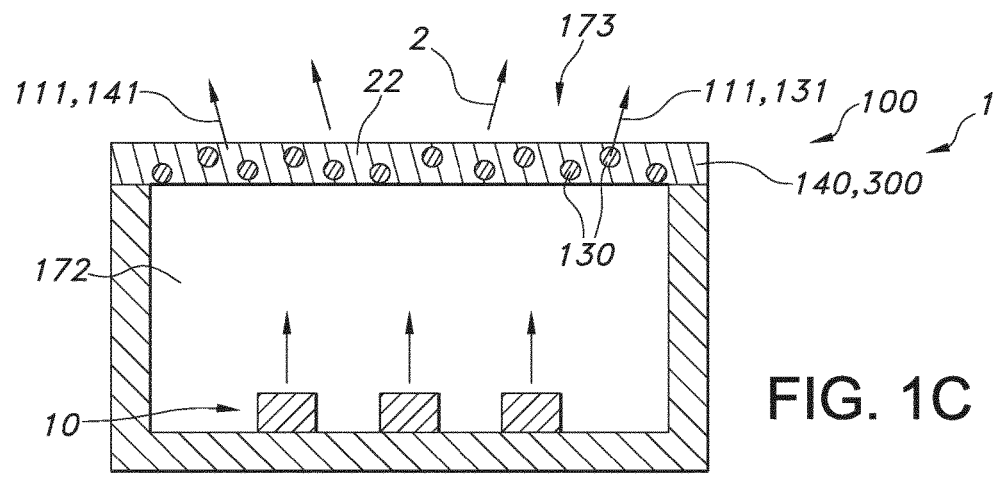

FIG. 1c schematically depicts an embodiment wherein the light converter 100 comprises the second luminescent material 130, e.g. in the form of quantum dots, and the luminescent material 140 as described herein. Both the luminescent material 140 and the second luminescent material 130 are in this embodiment embedded in the (remote) light converter, i.e. embedded in the (polymeric) matrix of the light converter 100.

Figure 1D:
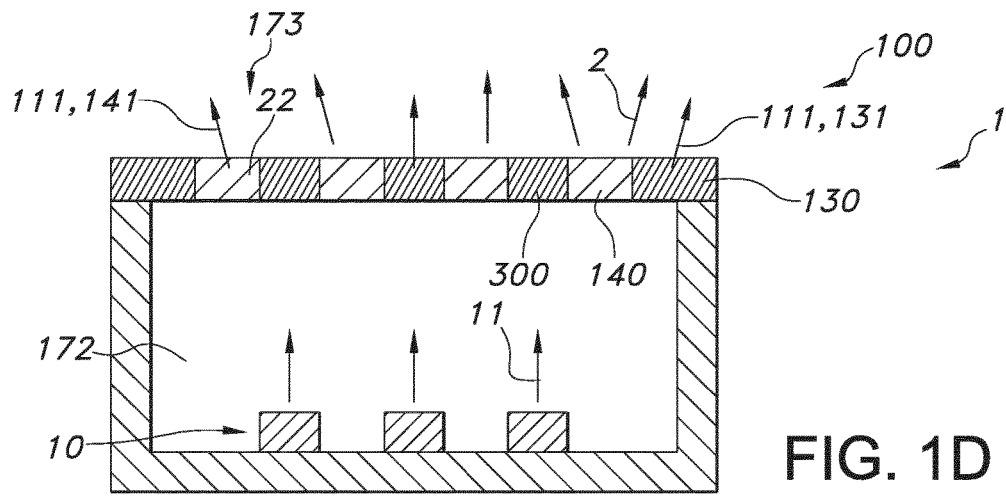

FIG. 1d schematically depicts an embodiment wherein the transmissive part 173 comprises at least two types of segments, with volumes over 0.25 cm$^3$, wherein the two types of segments comprise different weight ratios luminescent material and second luminescent material. For instance, first segments only comprise the luminescent material 140 as luminescent material and second segments only comprises second luminescent material 130 as luminescent material. The luminescent material 140 may also in this embodiment be embedded in a (polymeric) matrix, such as PET. Likewise, also the second luminescent material 130 may be embedded in a (polymeric) matrix, such as PET.

Figure 1E:
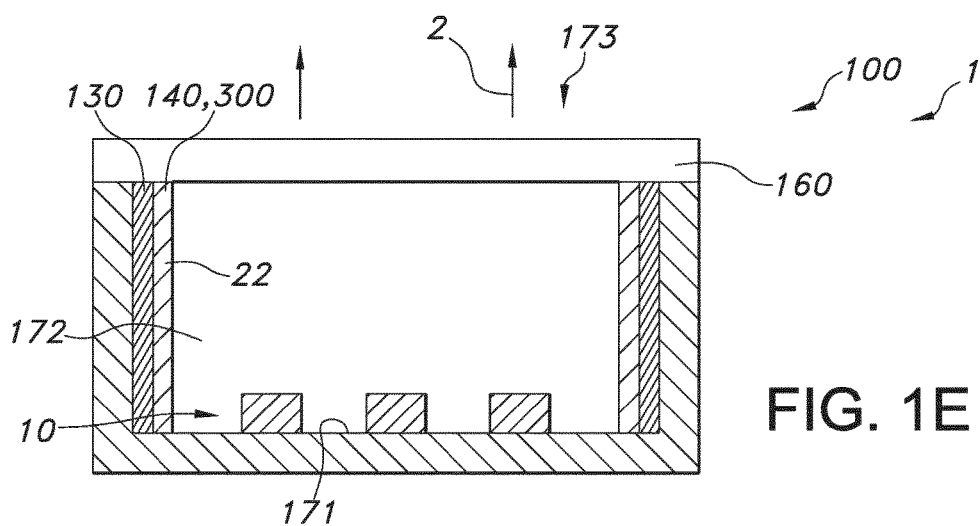

FIG. 1e schematically depicts an embodiment wherein the enclosure 170 comprises a transmissive diffuser 160 (as transmissive part 173) and the light converter is applied to at least part of the non-transmissive part of the enclosure 171.

Figure 1F:
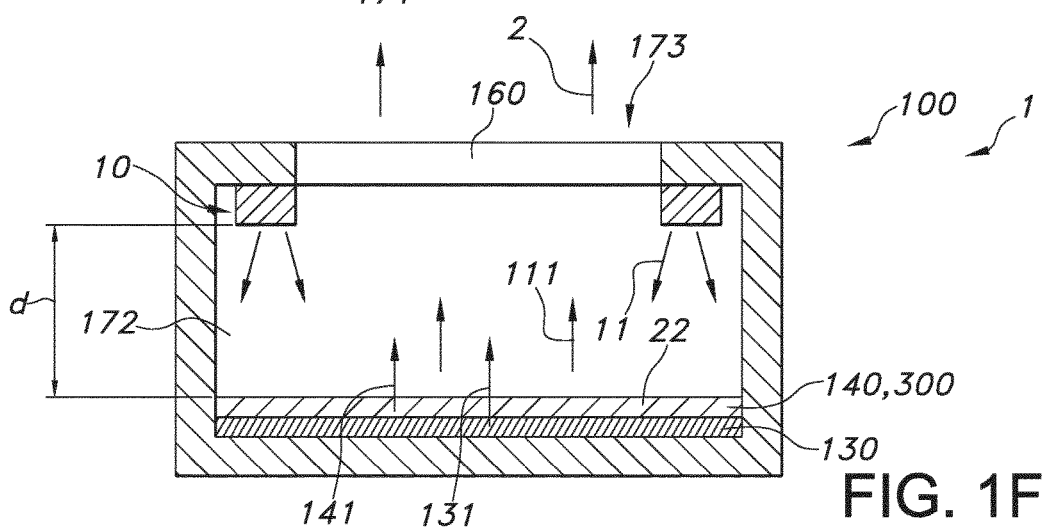

FIG. 1f schematically depicts a reflective configuration. As mentioned above, the luminescent material 140 and optionally the second luminescent material 140 may (both) be embedded in a (polymeric) matrix.

Combinations of embodiments may be applied, like the segmented light converter of FIG. 1d in combination with or alternative to the light converter(s) shown in the other drawings, such as e.g. 1a, 1b, 1e, 1f.

Figure 1G:
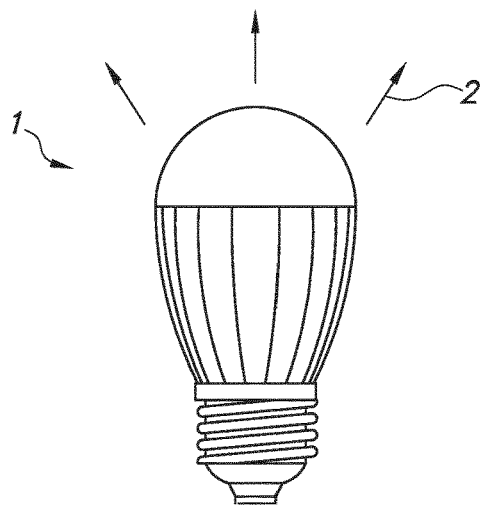
Figure 1H:
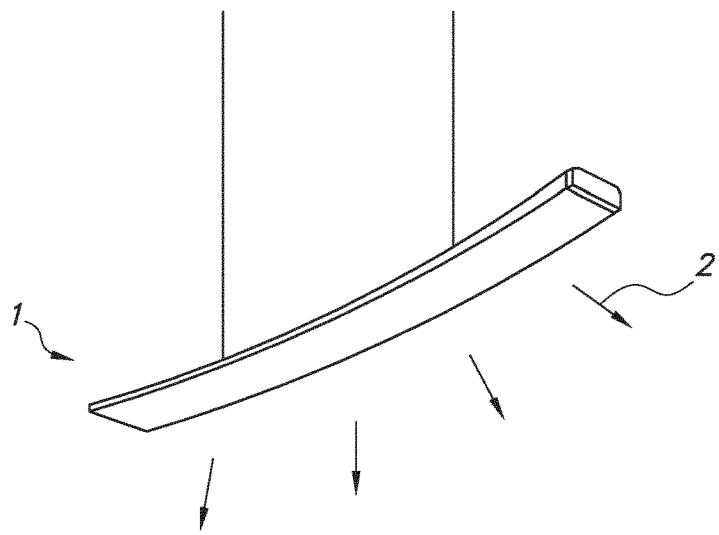

FIG. 1g schematically shows a retrofit lamp, which is a specific embodiment of the lighting device 1 as defined herein and FIG. 1h schematically depicts a luminaire, which may be another embodiment of the lighting device 1 as defined herein.

In FIGS. 1a-1d, the lighting device comprises a light transmissive window, which comprises or consists of the matrix. Hence, the matrix may be applied as light transmissive window. In FIGS. 1e-1f, a transmissive diffuser is used as transmissive window. The transmissive window is used as an envelope, or as part of an envelope. Here, the transmissive window envelopes at least part of the cavity 172. Note that the transmissive window is not necessarily flat. The transmissive window, comprising in embodiments the matrix, may also be curved, like in the embodiment of a TLED or in a retrofit incandescent lamp (bulb).

Figure 2A:
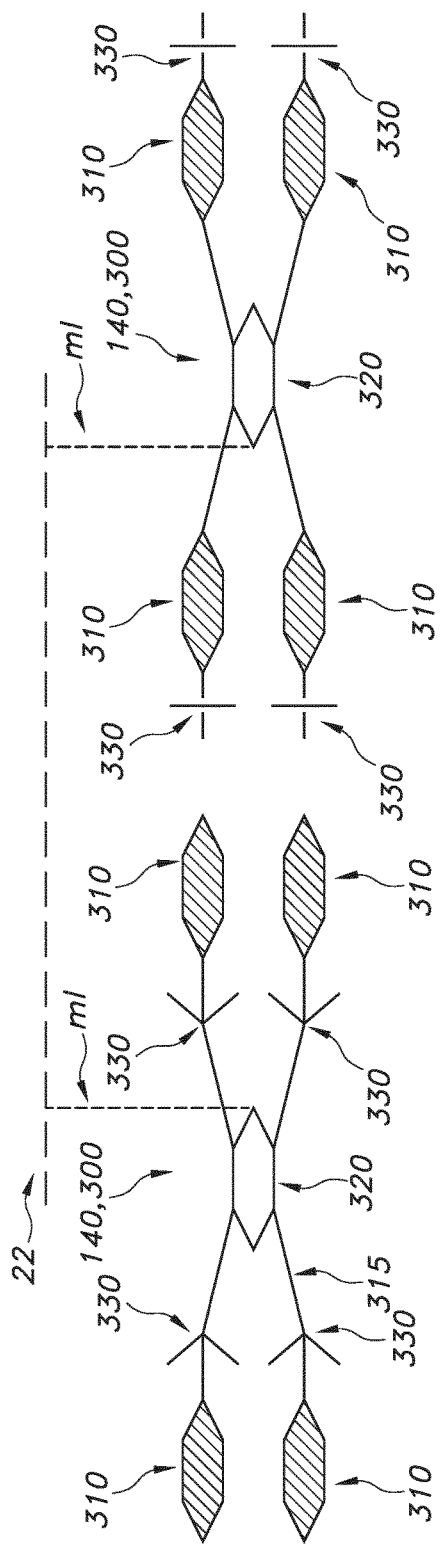
FIG. 2a-2e show some information on the phosphors and some experimental results.

FIG. 2a very schematically depicts on the left side a luminescent molecule 300 with a second group 320 (acceptor for generating red light), first groups 310 (donor for receiving blue and/or UV light and transferring energy to the acceptor), covalently being linked with each other, and with bulky groups 330, which are by way of example arranged between the first and second groups. Reference 315 indicates linkers, which in these schematic drawing provide the covalent links between the first and second groups, and which may optionally include the bulky group(s) 330. Here, the dashed line ML indicates a link with a (polymeric) matrix, the latter very schematically indicated with the dashed line 22. Such polymeric matrix may completely enclose the molecule, as the molecule 300 may be molecularly dispersed in the matrix. The luminescent groups are only by way of example schematically depicted as 6-rings. FIG. 2a shows on the right side another molecule 300, wherein the bulky groups are attached to the first groups 310, and not arranged between the first groups 310 and the second groups. Further, by way of example no linkers are used and the first groups 310 are directly linked to the first group. Example of relevant first groups in conformance with the right example is e.g. are molecules or groups 2324 and 2363 (see above). By way of example, these embodiments of molecules 300 are both attached to a (polymeric) matrix 22. For instance, they may be molecularly dispersed in the matrix and form a bond with the matrix. For instance, the links ml may be based on cross-linkable groups.

Figure 2B:
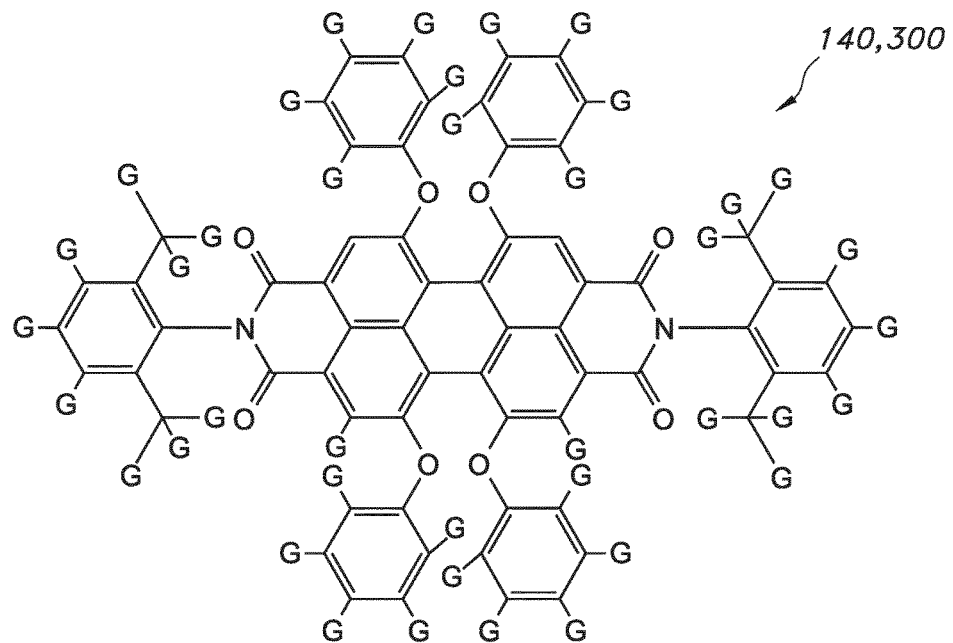
Figure 2C:
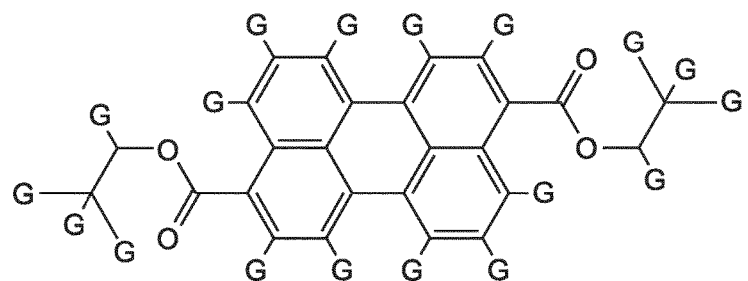

FIG. 2b shows the molecule F300 (or F305), as an example of a second group, with at each free position a G group. Hence, FIG. 2b shows a molecule that is a derivative of F300, which is on its turn one of the possible molecules based on formula I (see above). The molecule or group may be used as second group. These G-groups may differ for each position, but are named for the sake of understanding all G. The G-groups may independently be selected from—amongst others—H, R, OR, and a halogen (see also above, such as for the definition of R). Further, one or more of the G-groups may be covalently linked to a matrix when the molecule is embedded in a (polymeric) matrix. In a specific embodiment substantially all G's are H atoms, (except) with especially one or more G's, such as 1-6 G-groups being covalently linked to another luminescent group (first group(s)). Further, one or more G's may be covalently linked to the matrix, when the molecule 300 would be embedded in a matrix. Referring to amongst others FIGS. 2a-2b, two adjacent first and second groups 310,320 (at the same molecule) may especially be arranged at a shortest distance from each other equal to or smaller than about 10 nm, especially equal to or smaller than about 5 nm, such as equal to or smaller than 2.5 nm. At such distances, Förster resonant energy transfer (FRET) may take place. FIG. 2c schematically depicts F084, as an example of a first group, with at each free position a G-group. Hence, the molecule depicted in FIG. 2c is a derivative of F084. Also here applies that the G-groups may independently be selected from H, R, OR, and a halogen (see also above, such as for the definition of R). Further, one or more of the G-groups may be covalently linked to a matrix when the molecule is embedded in a matrix. In a specific embodiment substantially all G's are H atoms, (except) with especially one or more G's, such as 1-6 G-groups being covalently linked to another luminescent group (second group(s)) or covalently linked to a matrix. FIGS. 2b and 2c are especially depicted to show that each group or molecule defined herein may also represent its derivatives, with one or more substituents (other than e.g. H).

Compound 2452 (see above) was synthesized. The structure of the red moiety in the center is similar to F-300. 2452 is derived from compound 2409 (see below), the four yellow moieties are derived from the yellow dye F-084 (see above):

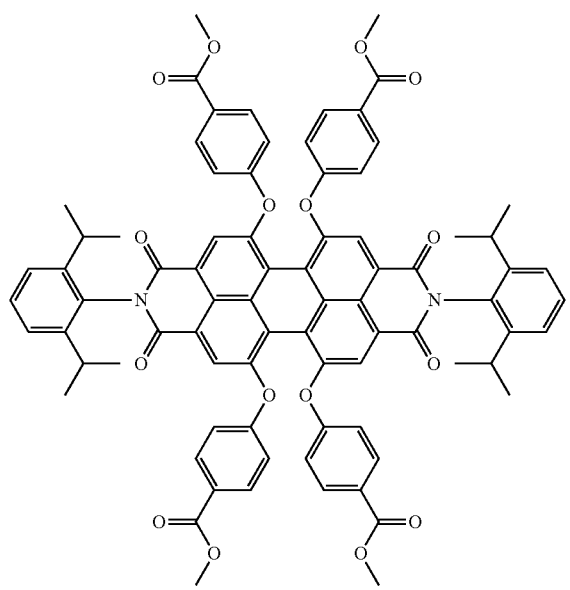

2409

Also compound 2455 (see above) was synthesized. The structure of the red moiety in the center is similar to F-300, officially derived from compound 2354 (see below), the four yellow moieties (in 2455) are derived from the yellow dye F-084 (see above).

2354

Figure 2D:
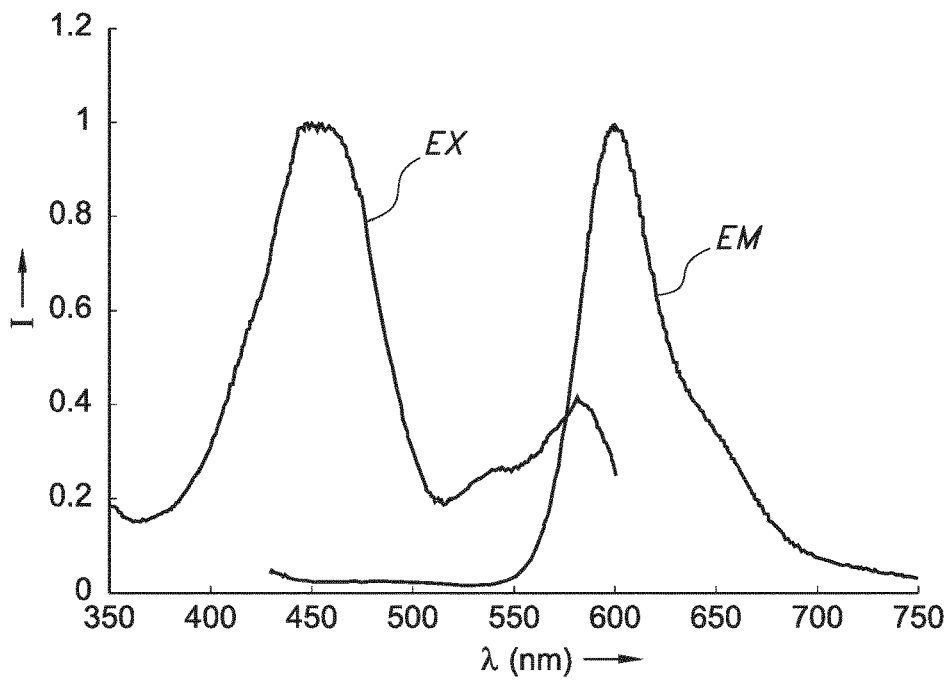

The absorption (or excitation) spectra of 2452 and of 2455 in PMMA or chloroform are exactly the addition spectra of 4:1 mixture of F084 and 2409 and of F084 and 2354, respectively. However, the emission of the yellow part around 500 nm (similar to the emission of F084) is completely absent in both molecules (see FIG. 2d, showing normalized excitation (EX) and emission spectrum (EM) of 2455 in PMMA, with on the x-axis λ in nm and on the y-axis the intensity in arbitray units and maximum intensity normalized to 1). The same is observed for compound 2452. Only the emission of the red moiety (similar to the emission of 2354 or 2409) is observed. This is an indication of quantitative energy transfer from the excited state of the yellow moiety to the red moiety.

Figure 2E:
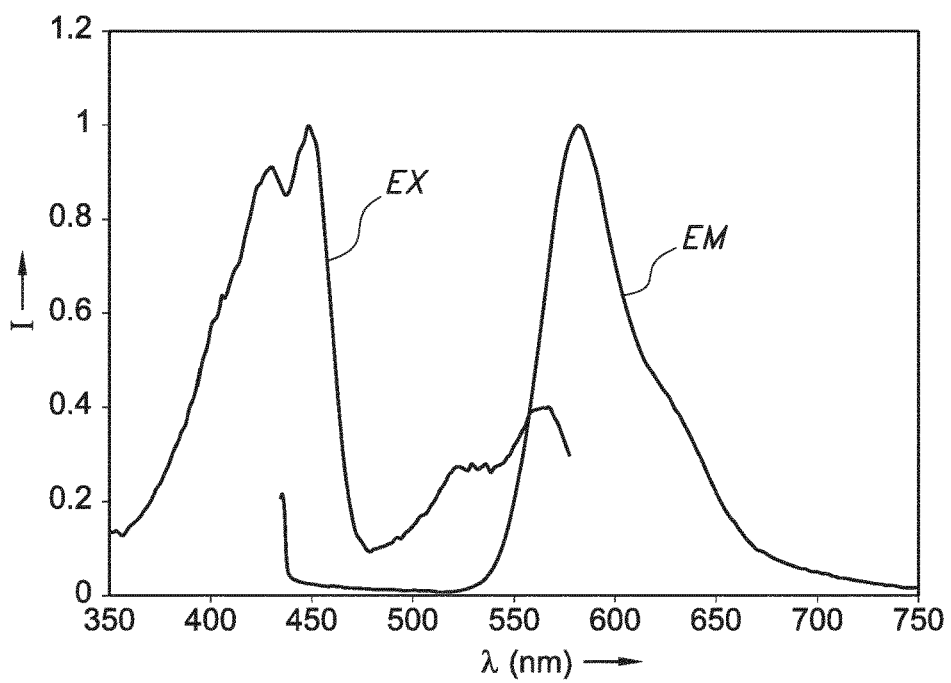

However, when the PLQE (photo luminescence quantum efficiency) was measured, a relative low value was obtained. Because the PLQE of red compounds 2409 and 2354 is 0.9, it is suspected that energy loss occurs in the yellow moiety's. These yellow moieties are covalently linked to the red moiety and therefore brought in close contact with each other or may even form an aggregated structure. The result will be quenching of the excited state. In order to avoid this quenching a new molecule 2440 (see above) was made with derived from red 2409 (see above) and yellow 2363. Compound 2363 (see above) contains a diisipropylphenylimide moiety that prohibits close contact or even aggregation. FIG. 2e (showing the normalized excitation EX) and emission spectrum (EM) of 2440 in PMMA) shows that this compound also exhibits nearly quantitative energy transfer. The PLQE value of this compound is equal to that of 2409 namely 0.9. Thus the sterical hindrance introduced by the diisipropylphenylimide avoids quenching of the "yellow" molecular moieties.

Further, the stability of the molecules in a PMMA film was tested by measuring the lifetime under illumination with blue laser light at 2.8 W/cm² at 60° C. The decrease in red emission was measured and from the exponential plot the decay rate was calculated and presented in table 1.

TABLE 1

Decay rate for different emission bands of several dyes in PMMA irradiated at 450 nm at 60° C., with K indicating a decay constant.

| Dyes | K for yellow emission ($s^{-1}$) | K for red emission ($s^{-1}$) |
|---|---|---|
| 0.05 wt % 2363 | 5E-5 | |
| 0.035 wt % 2409 | | 1E-7 |
| 0.09 wt % 2440 | | 9E-7 |
| 0.36 wt % F-305 | | 1.3E-7 |

($I(t) = I(0) * \exp(-Kt)$. $I(t)$ is the fluorescent intensity after t (seconds) radiation, $I(0)$ is the starting fluorescent intensity and t is in seconds).

The table shows that 2409 has nearly the same lifetime as F-305, a dye that is applicable in lighting solutions. It shows that the stability of the yellow moiety in 2440 that is derived from 2363 has a much better lifetime than 2363 itself. Thus the photo degradation of these materials is much slower under energy transfer conditions than under fluorescent conditions. The molecule 2440 decays 8 times faster compared to 2409 and this is probably due to the fact the absorption coefficient of 2440 at 450 nm is nearly 8 times higher than that of 2409.

Figure 3A:
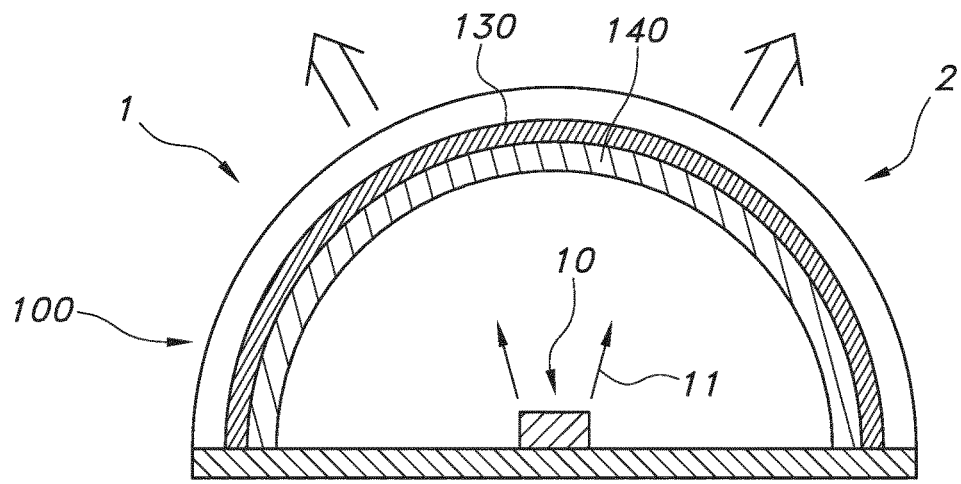
FIG. 3a-3b show some information on the phosphors and some experimental results.

A retrofit tube was made from blue leds and a "red" layer containing 2440 (upstream layer in FIG. 3a, reference 140) and a "yellow" layer (downstream in FIG. 3a, reference 130) made from YAG:Ce mixed with organic yellow dye 2389.

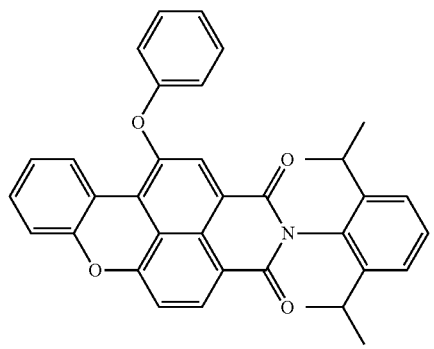

2389

The tube has a correlated color temperature of (CCT) 4000K and a color rendering index (CRI) of around 80 on the black body line (BBL). Using compound 2440 and the yellow mixture described above, a lamp with a conversion efficiency of 248 lm/W (blue light) was produced. This leads to a lamp with an electrical efficacy of 173 lm/W (electrical) if this phosphor is used with LEDs with wall plug efficiency of 70%.

Some dyes were checked on their quantum efficiency in relation to the presence of a bulky di-isopropyl groups in the yellow part, see table 2 below. Thereto another molecule 2517 (see above) was made containing these same bulky groups derived from 2409 (see above) and 2324 (see above). This molecule 2517 also showed a much higher PLQE than 2452 or 2455.

TABLE 2 comparison of dyes with or without a bulky group.

| FRET-dye | Di-isipropyl groups | PLQE in $CHCl_3$ |
|---|---|---|
| 2452 | no | <0.5 |
| 2455 | no | <0.5 |
| 2440 | yes | 0.81 |
| 2517 | yes | 0.66 |

Figure 3B:
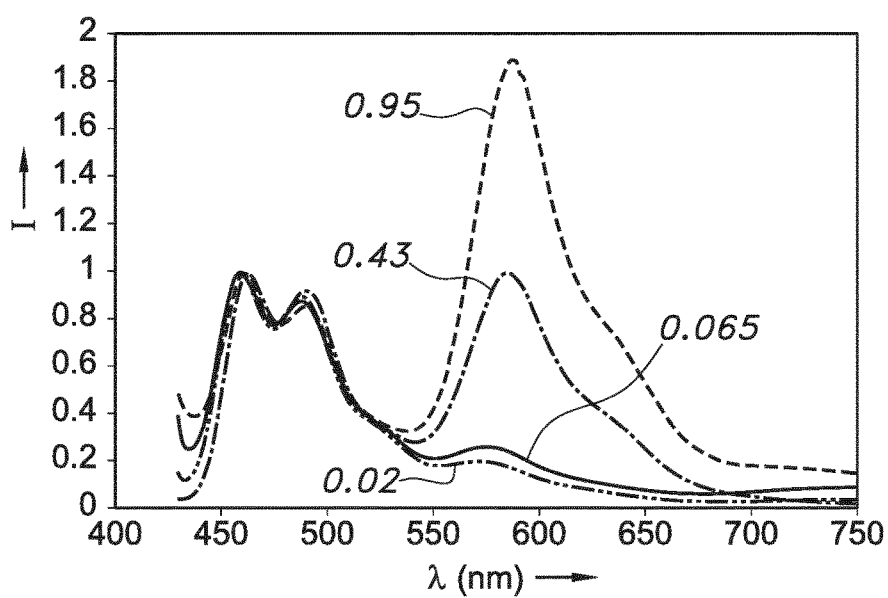

Further, the influence of mixture concentration on FRET was evaluated (see also FIG. 3b, showing emission spectra ($\lambda_{ex}$=410 nm) of mixtures of 2363 and 2409 in a 4:1 molar ratio with different total weight percent of 2363 and 2409 in PMMA). To investigate the influence of mixture concentration on energy transfer, mixtures of 2363 (indicating a yellow emitting organic molecule) and 2409 (indicating a red emitting organic molecule) with a 4:1 molar ratio in PMMA of various total weight percent of 2363 and 2409 were made. Film thicknesses were controlled to guarantee an absorbance lower than 0.1 at 450 nm. This is done to assure a linear relation between fluorescence intensity and concentration which is merely valid at very low absorbance. At high concentration, self-quenching (collisions between excited states) and self-absorption (when absorption and fluorescence band overlap) cannot be ignored. This can amongst others be concluded from the red shift of the yellow emission (which shift is indicative of self absorbtion).

In the FIG. 3b, the emission spectra excited at 410 nm are normalized to the yellow maximum at around 460 nm. As the concentration increases, relative red emission becomes more intensive, which means that energy transfer occurs more effectively. The value 0.95 indicates 0.95 wt. % 2363 and 2409 in a 4:1 molar ratio; likewise, the values 0.43, 0.065 and 0.02 indicate the weight percentage of 2363 and 2409 in a 4:1 molar ratio in PMMA.

Figure 4A:
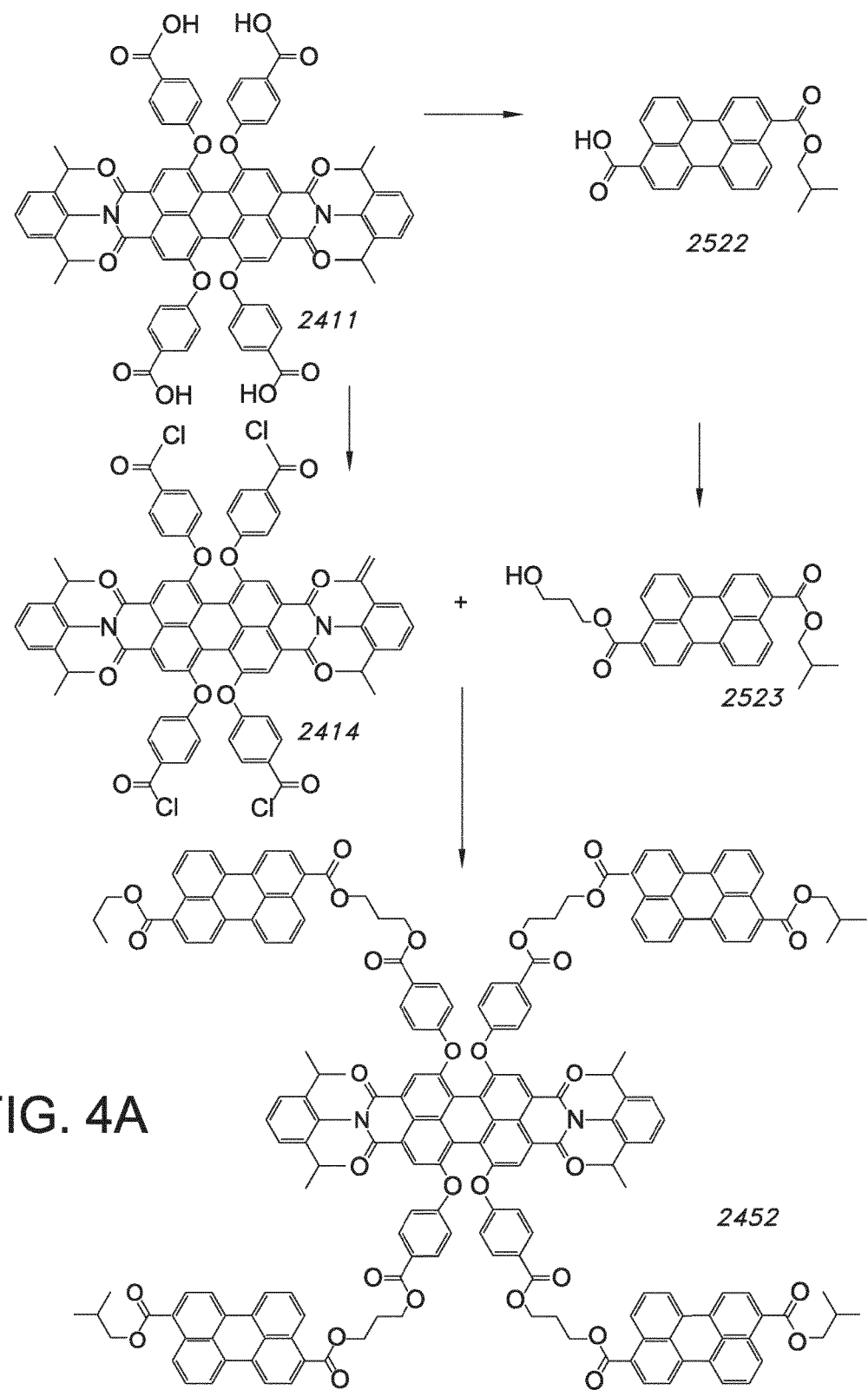
FIGS. 4a-4d schematically show some of the synthesis performed.

Synthesis of 2452. (Scheme in FIG. 4A).

A: 2414.

Oxalyl chloride (1.2 mL, 14.28 mmol) was added drop wise at 0° C. to a suspension of 2411 (1.5 g, 1.19 mmol, prepared according to: Yang et al., *J. Am. Chem. Soc.* 2011, 133, 9964-9967) and DMF (2 drops). The mixture that slowly turned from a suspension to a clear solution was stirred over night at room temperature then concentrated under reduced pressure. The solid obtained was washed with heptane and vacuum dried. Compound 2414 (1.5 g, 95%) obtained as a red solid.

B: 2523.

To a solution of 1,3-propandiol (1.4 mL, 20.0 mmol), DMAP (1.5 g, 12.0 mmol) and pyridine (1.2 mL) in THF (150 mL) at 0° C. was added dropwise a solution of acid chloride 2522 (1.6 g, 3.8 mmol) in THF (160 mL). After 10 minutes, DCC (800 mg, 3.9 mmol) was added and the mixture was stirred overnight at room temperature. The mixture was then diluted with DCM, washed with water, dried ($Na_2SO_4$), filtered and concentrated. Compound 2523 was then purified on column chromatography ($SiO_2$) eluting with DCM/TBME 4/1 to 3/1. Compound 2523 (1.5 g, 86%) was obtained as an orange solid.

C: 2452.

To a solution of compound 2523 (1.5 g, 3.3 mmol) in DCM (50 mL), THF (100 mL) and pyridine (2 mL) at 0° C. were added DMAP (417 mg, 3.4 mmol) and tetra acid chloride 2414 (758 mg, 0.57 mmol). The reaction mixture was stirred 50 h at 50° C. and was concentrated under reduced pressure. The residue was coated on silica gel and was poured on top of a column containing $SiO_2$. Elution with DCM/TBME 40/1 offered two fraction of compound 2452 containing a different ratio of isomers (yellow part) not completely pure. Triturated with heptane and with MeOH and filtered (2×) on a glass filter and dried under reduced pressure at 50° C. gave 2452 as a dark red powder (175 mg and 440 mg, 36%). M+Na=3024, 1 (100% peak in MALDI). $\lambda_{max}$ (chloroform)=468 nm, $\varepsilon$=104900 and 560 nm, $\varepsilon$=44500. $\lambda$ (em) (chloroform) 591 nm.

Figure 4B:
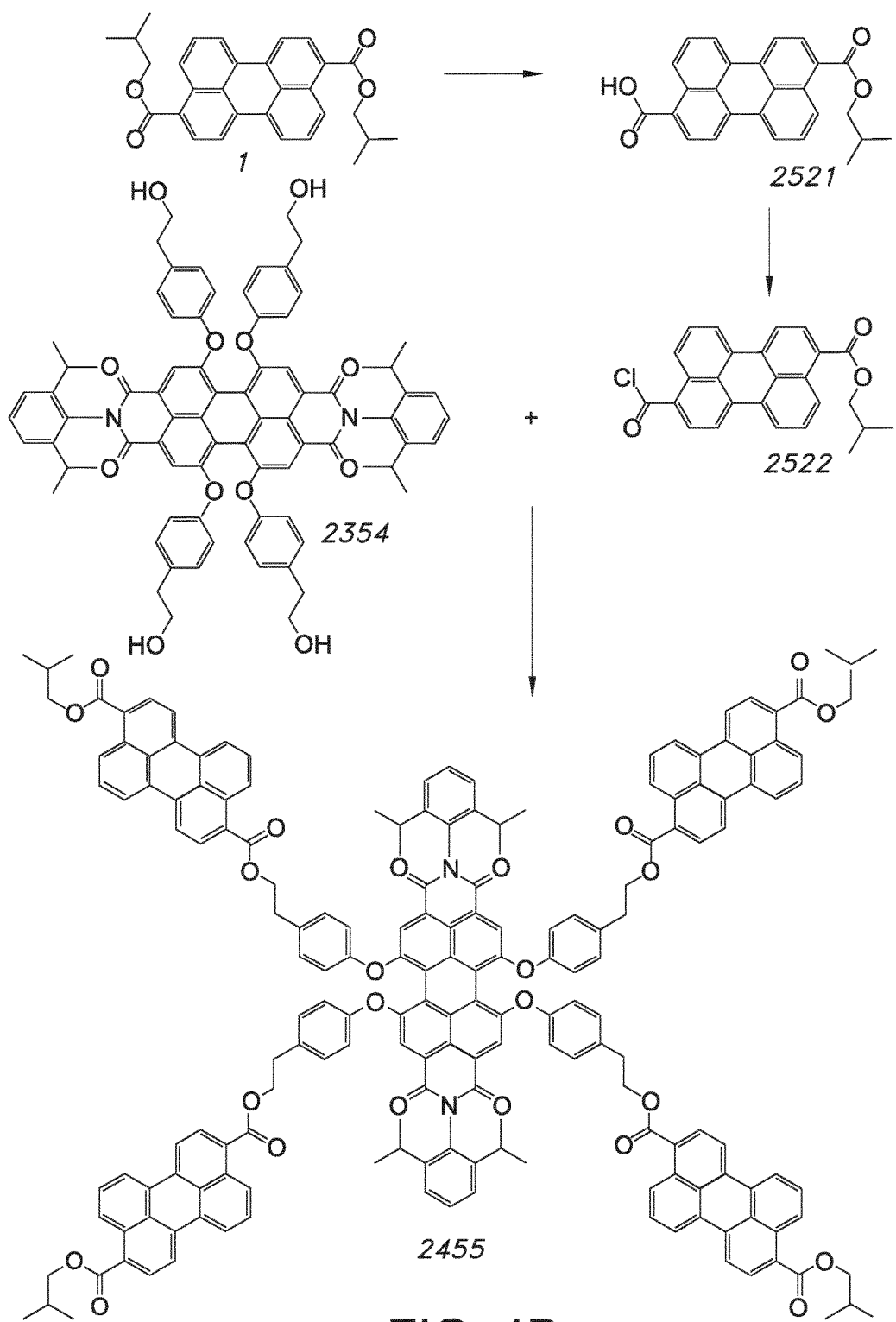

Synthesis of 2455. (Scheme in FIG. 4B).

A: 2521.

A suspension of diester 1 (5 g, 11.05 mmol, obtained from TCI)) in 1,4-dioxane (300 mL), toluene (100 mL) and water (2 mL) was refluxed until a clear orange solution was obtained. KOH (741 mg, 13.20 mmol) in 1,4-dioxane (200 mL) and water (3 mL) was added dropwise over 1 h. The mixture was refluxed overnight, cooled to room temperature and concentrated under reduced pressure. The residue was triturated with DCM and filtered to remove remaining diester 1. Washing with DCM was repeated until TLC of the solid residue in 1,4-dioxane indicated that all compound 1 has been removed. The orange solid was dissolved in 1,4-dioxane and a solution of 4 N HCl in 1,4-dioxane (80 mmol, 20 mL) was added. The mixture was stirred 10 minutes and concentrated under reduced pressure. The residue was triturated in water and filtered to remove the salts. The solid collected was washed again with water then with heptane and dried in vacuum to give compound 2521 as an orange solid (1.5 g, 36%).

B: 2522.

Oxalyl chloride (3.4 mL, 40 mmol) was added drop wise at 0° C. to a suspension of 2521 (1.5 g, 4.0 mmol) and DMF (2 drops). The mixture that slowly turned from a suspension to a clear orange solution was stirred 3 h at room temperature then concentrated under reduced pressure. The solid obtained was washed with heptane and vacuum dried. Compound 2522 (1.6 g, 96%) was obtained as an orange solid.

C: 2455.

To a solution of compound 2354 (378 mg, 0.30 mmol, prepared according to: Klok et al., *Macromol. Biosci.* 2003, 3, 729-741) in DCM (50 mL), THF (100 mL) and pyridine (2 mL) at 0° C. were added DMAP (147 mg, 1.20 mmol), acid chloride 2522 (1.0 g, 0.2.41 mmol) and DCC (62 mg, 0.30 mmol). The reaction mixture was stirred 50 h at 50° C. and was concentrated under reduced pressure. The residue was washed with heptane and with MeOH to remove yellow impurities. Compound 2455 was further purified by a first column chromatography ($SiO_2$, elution with DCM/TBME 30/1). A second column chromatography ($SiO_2$, elution with DCM/MeOH 200/1) afforded pure compound 2455 (445 mg, 53%) as a dark red powder. M+Na=2792, 2 (100% peak in MALDI). $\lambda_{max}$ (chloroform)=466 nm, $\varepsilon$=99100 and 579 nm, $\varepsilon$=41600. $\lambda$ (em) (chloroform) 607 nm.

Figure 4C:
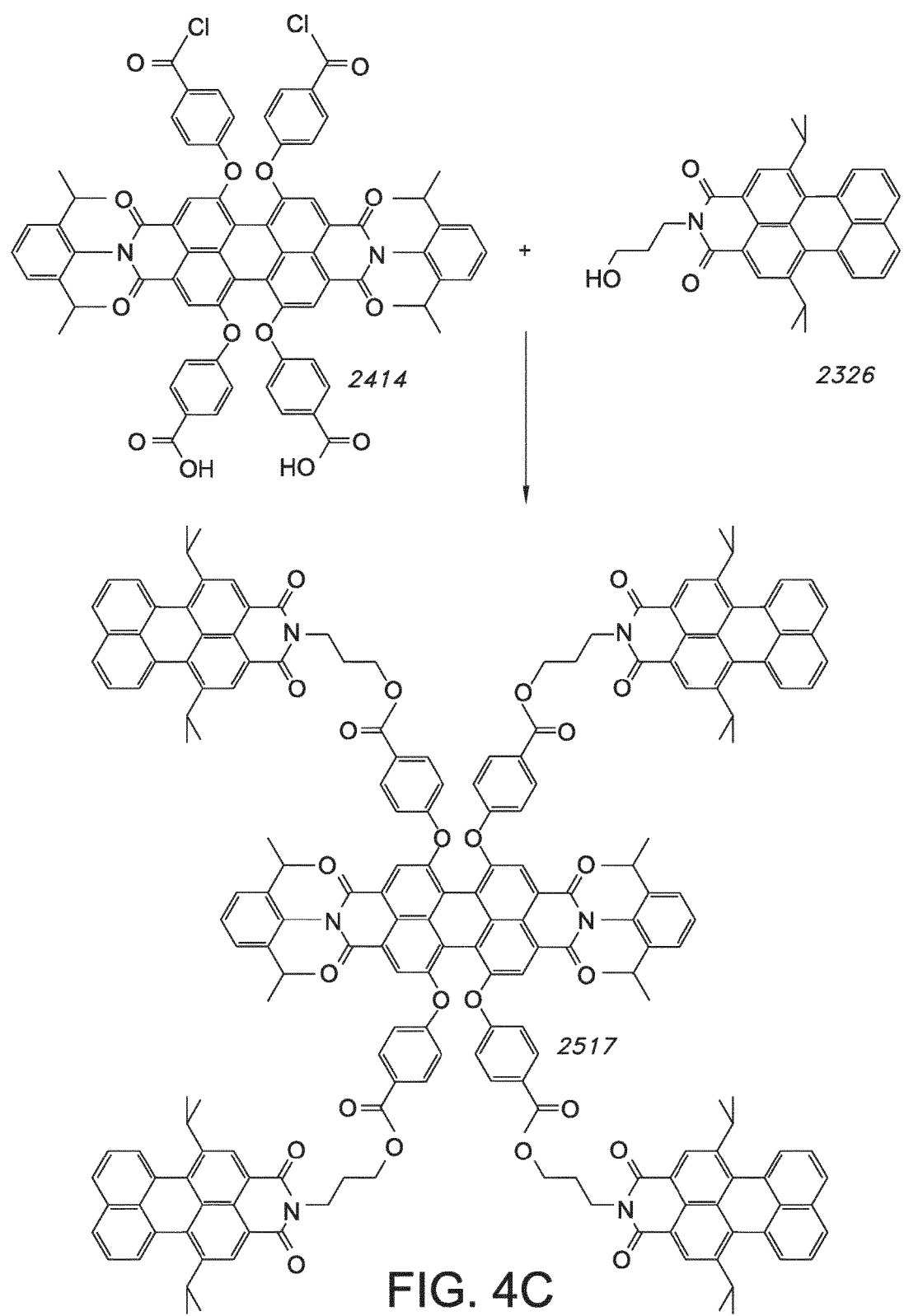

Synthesis of 2517. (Scheme in FIG. 4C).

To a solution of compound 2326 (450 mg, 0.83 mmol, prepared according to: US2014153247) in DCM (20 mL), THF (20 mL) and pyridine (0.5 mL) at 0° C. were added DMAP (98 mg, 0.80 mmol), tetra acid chloride 2414 (213 mg, 0.16 mmol) and DCC (132 mg, 0.64 mmol). The reaction mixture was stirred 50 h at 60° C. and was concentrated under reduced pressure. The residue was coated on silica gel and was poured on top of a column containing $SiO_2$. Elution with DCM/TBME 50/1 to 30/1 offered a first fraction containing compound 2517. Not completely pure compound 2517 was triturated with heptane and with hot MeCN and filtered (2×) on a glass filter and dried under reduced pressure at 50° C. to give 2517 as a dark red powder (220 mg, 41%). M+Na=3364, 2 (100% peak in MALDI). $\lambda_{max}$ (ethyl acetate)=504 nm, $\varepsilon$=125000 and 558 nm, $\varepsilon$=40800. $\lambda$ (em) (ethyl acetate) 599 nm.

The invention also relates to the above indicated chemical processed to obtain one or more of the compounds 2452, 2455, 2440, 2517, especially starting from the compounds indicated and especially under substantially the same conditions as indicated.

Figure 4D:
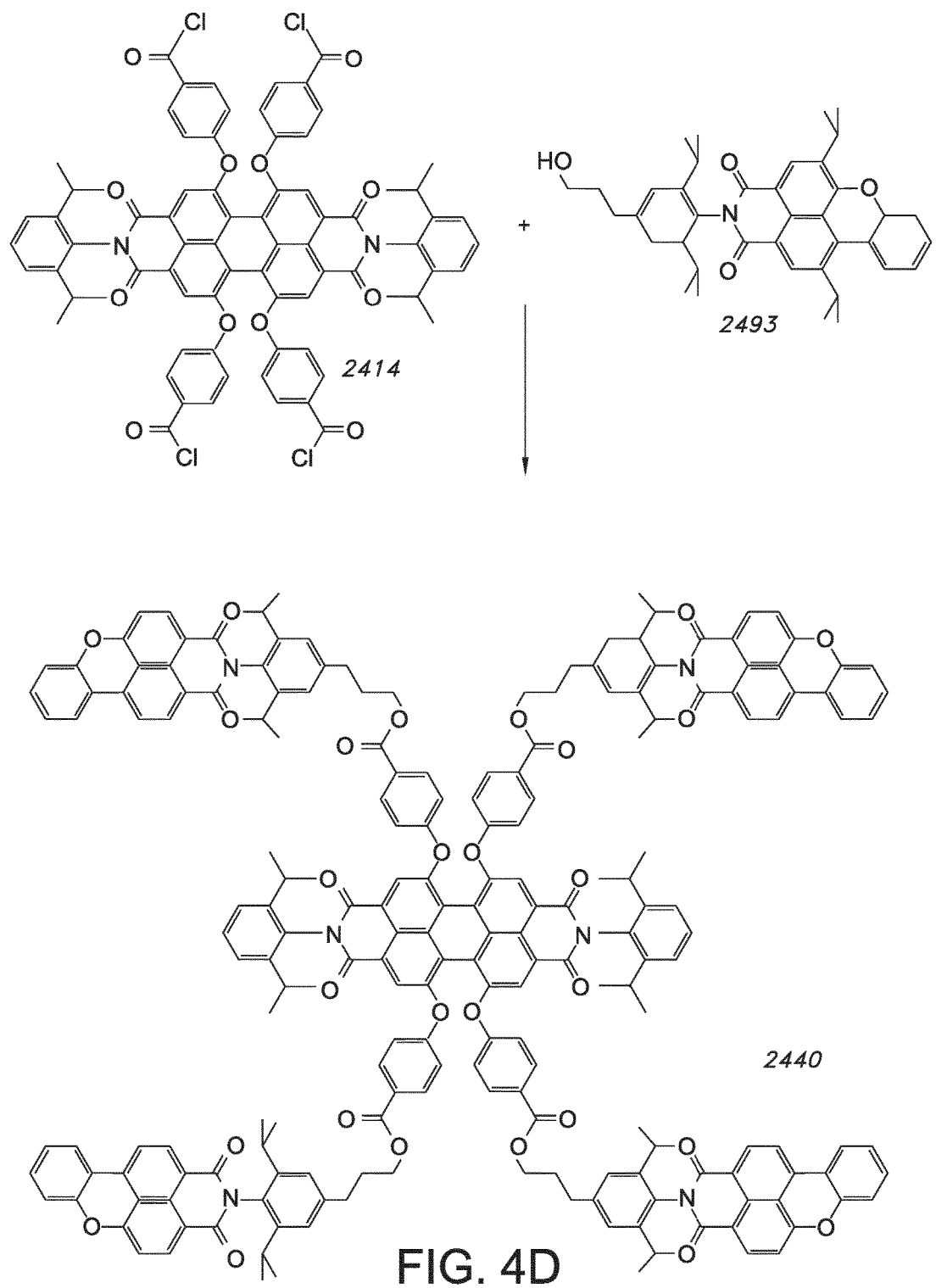

Synthesis of 2440. (Scheme in FIG. 4D).

A: 2493.

Anhydride 2460 (1.7 g, 5.9 mmol, prepared according to: Peters et al., *J. Soc. Dyes and Colorants* 1989, 105, 29.), aniline 2323 (1.7 g, 7.1 mmol, prepared according to: Schrekker et al., *Macromolecules* 2006, 39, 6341-6354) and zinc acetate dihydrate (1.5 g, 7.1 mmol) were mixed with imidazole (30 g). The reaction mixture was stirred at 160° C. for 3 h under nitrogen. After cooling to room temperature, 5 N aqueous HCl was added to the mixture until an acidic pH was obtained and the aqueous layer was extracted with DCM (4×). The combined organic layers were washed with 1 N aqueous HCl, water, dried over $Na_2SO_4$, filtered and the solvent was removed under reduced pressure. Column chromatography ($SiO_2$) using DCM/EtOAc 50/1 to 10/1 afforded compound 2493 (2.3 g, 77%) as a yellow solid.

B: 2440.

To a solution of compound 2493 (2.8 g, 5.5 mmol) in DCM (150 mL), THF (50 mL) and pyridine (2 mL) at 0° C. were added DMAP (677 mg, 5.5 mmol) and tetra acid chloride 2414 (1.2 g, 0.9 mmol). The reaction mixture was stirred 50 h at 35° C. and was concentrated under reduced pressure. The residue was coated on silica gel and was poured on top of a column chromatography ($SiO_2$). Elution with DCM/TBME 50/1 to 30/1 offered a first fraction containing compound 2440. Further elution with DCM/TBME 20/1 gave recovered compound 2493 (800 mg). Solid compound 2440 was washed with MeOH and with heptane (2×) on a glass filter and dried under reduced pressure at 50° C. to give a red powder (2.2 g, 76%). M+Na=3228.3 (100% peak in MALDI). $\lambda_{max}$ (chloroform)= 427 nm, $\varepsilon$=162000 and 562 nm, $\varepsilon$=61600. $\lambda$ (em) (chloroform) 593 nm.

The invention also relates to the above indicated chemical processed to obtain one or more of the compounds 2452, 2455, 2440, 2517, especially starting from the compounds indicated and especially under substantially the same conditions as indicated.

The invention claimed is:

1. A lighting device comprising a light source configured to provide light source light having a blue light component and a light converter configured to convert at least part of the light source light into converter light, wherein the light converter comprises a polymeric matrix with a luminescent material, wherein the luminescent material comprises an organic luminescent molecule comprising a first group able to absorb at least part of the blue light component, and a second group able to emit luminescent molecule light having a red light component, wherein the organic luminescent molecule further comprises a bulky group, wherein the bulky group comprises a ternary or quaternary carbon, and wherein the bulky group is arranged between the first group and the second group, wherein the first group is configured to transfer at least part of the energy acquired by the absorption of said at least part of the blue light component to the second group for generation of said luminescent molecule light having a red light component, and wherein the second group comprises a group based on:

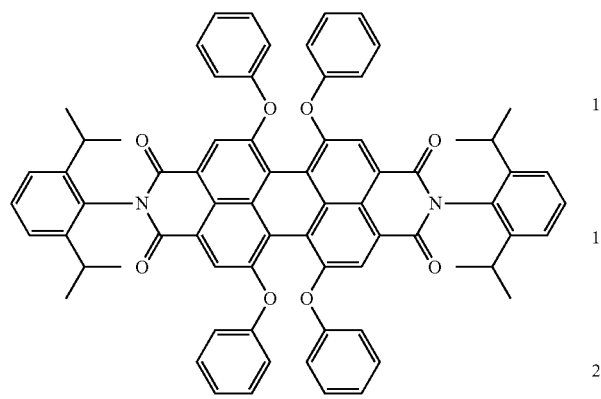
(F-300)

or a derivative thereof.

2. The lighting device according to claim 1, wherein the first group comprises a group configured to absorb at least part of the blue light component and is able to convert into one or more of green light and yellow light, wherein the second group is configured to absorb one or more of said green light and yellow light, and wherein the first group is configured as Forster resonant energy transfer donor and wherein the second group is configured as Forster resonant energy transfer acceptor.

3. The lighting device according to claim 1, wherein the luminescent molecule comprises one or more yellow donor groups as first group(s) and one or more red acceptor groups as second group(s).

4. The lighting device according to claim 1, wherein the first group comprises one or more groups based on one or more of:

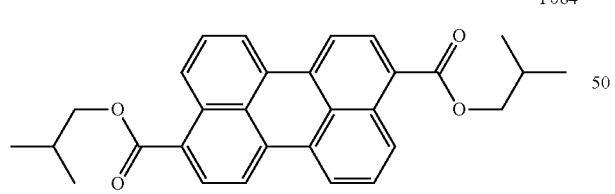
F084

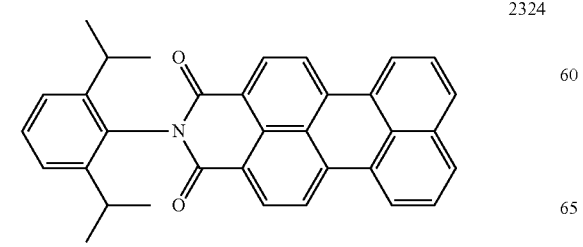
2324

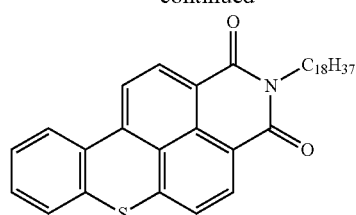
Solvent yellow

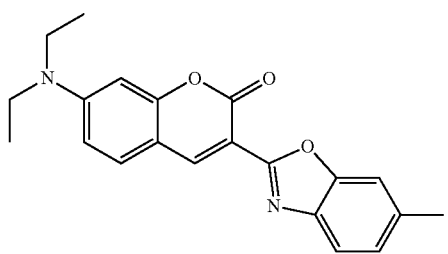
Disperse yellow

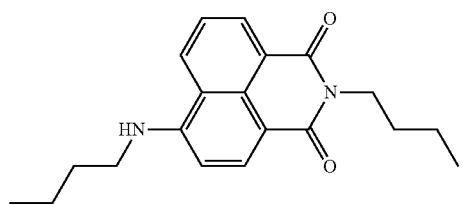
Fluorescent yellow and derivatives thereof.

5. The lighting device according to claim 1, wherein the bulky group comprises:

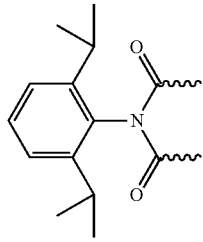

or a derivative thereof.

6. The lighting device according to claim 1, wherein the first group comprises one or more groups based on one or more of:

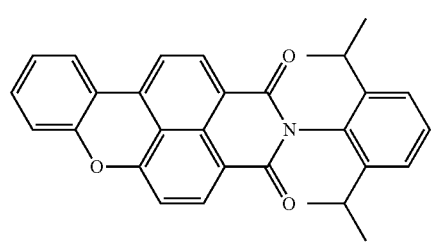
2363 and

-continued

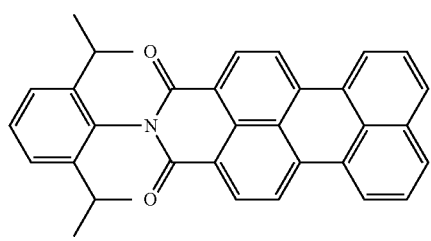
2324 and derivatives thereof.

7. The lighting device according to claim 1, wherein the first group and the second group are separated from each other with a covalently bound chain of at least 4 chemical bonds, wherein the chain comprises one or more of C, O, N and Si atoms.

8. The lighting device according to claim 1, wherein the number of first groups in the luminescent molecule is larger than the number of second groups.

9. The lighting device according to claim 1, wherein the luminescent molecule is selected from the group consisting of:

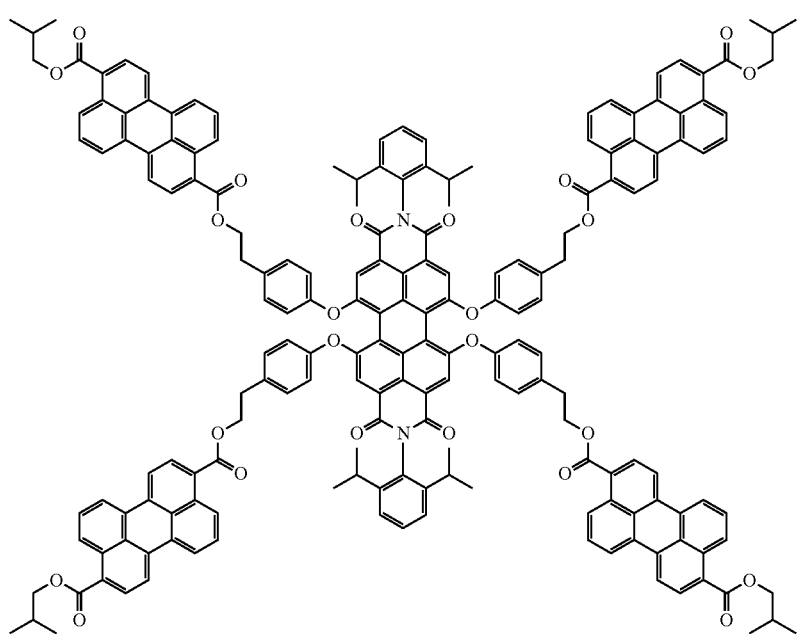
2455 and

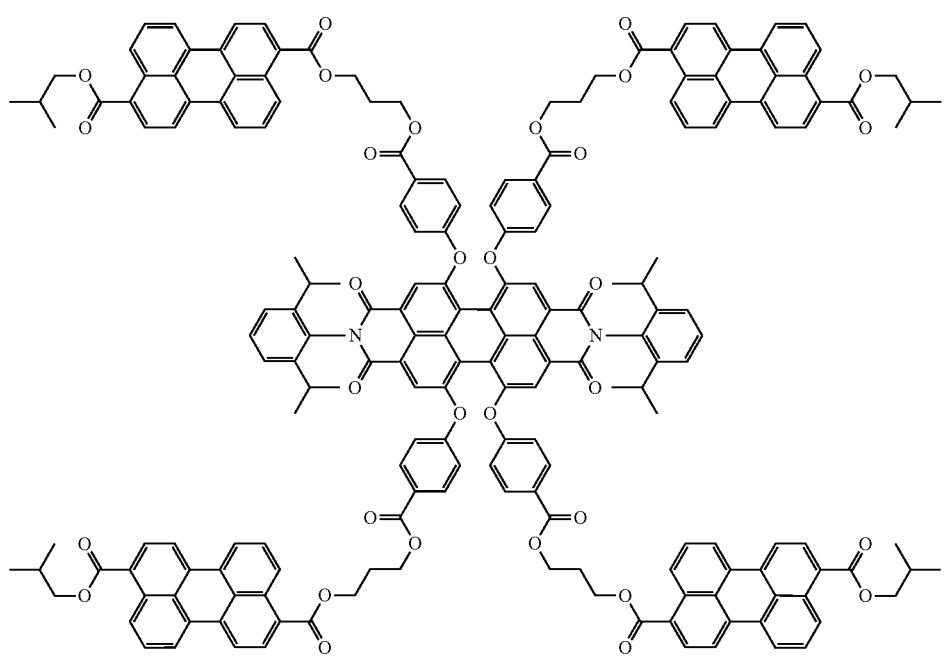
2452 and

-continued
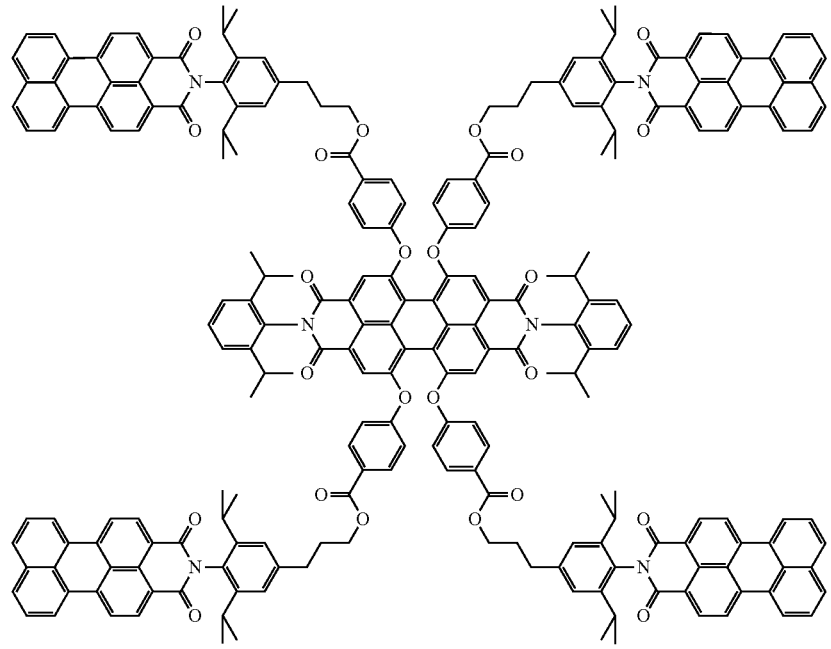
2517
and
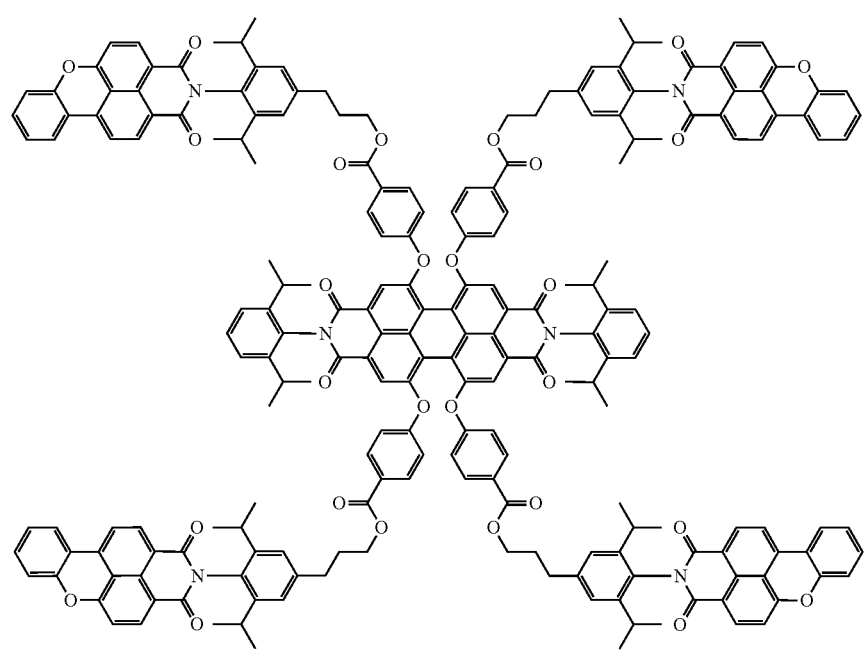
2440
and derivatives thereof.

10. The lighting device according to claim 1, wherein the light source comprises a solid state light source, wherein the matrix comprises one or more of polymethylmethacrylate, polyethylene terephthalate, and polyethylene naphtalate, and wherein the lighting device further includes a second luminescent material configured to provide second luminescent material light having one or more of green light component and a yellow light component.

11. A luminescent material comprising an organic luminescent molecule comprising a first group able to absorb at least part of the blue light component, and a second group able to emit luminescent molecule light having a red light component, wherein the first group is configured to transfer at least part of the energy acquired by the absorption of said at least part of the blue light component to the second group for generation of said luminescent molecule light having a red light component, and wherein the second group comprises a group based on:

(F-300)

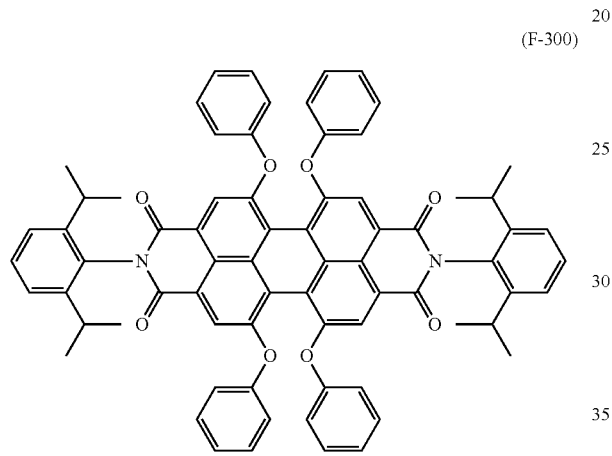

or a derivative thereof.

12. The luminescent material according to claim 11, comprising one or more of:

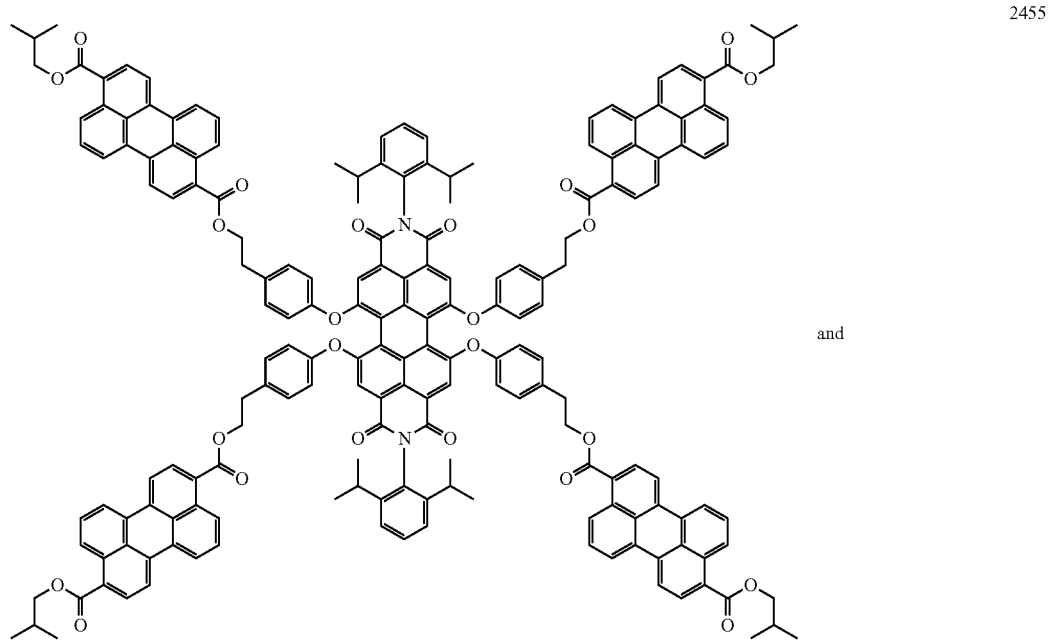

2455 and

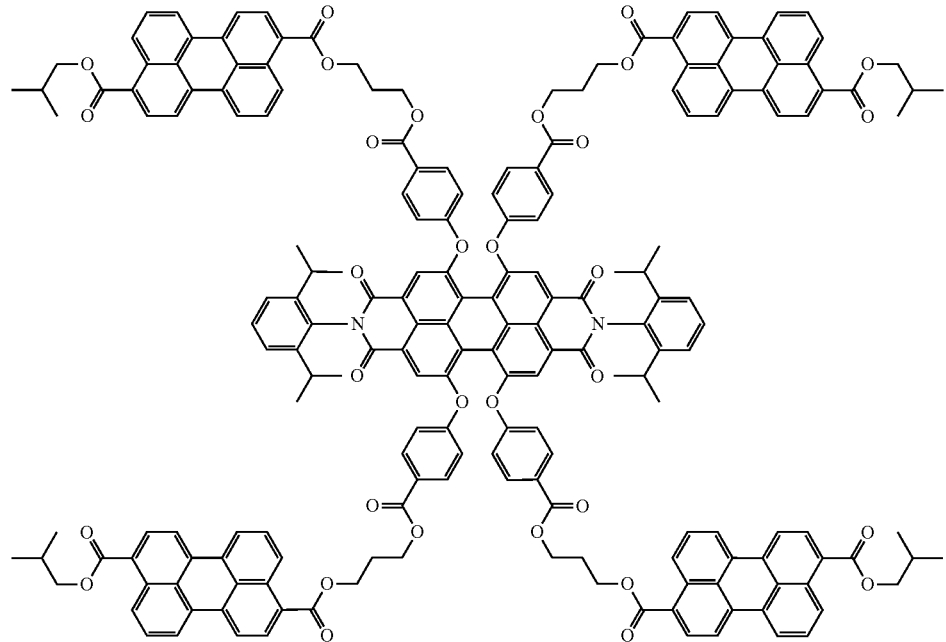
2452
and
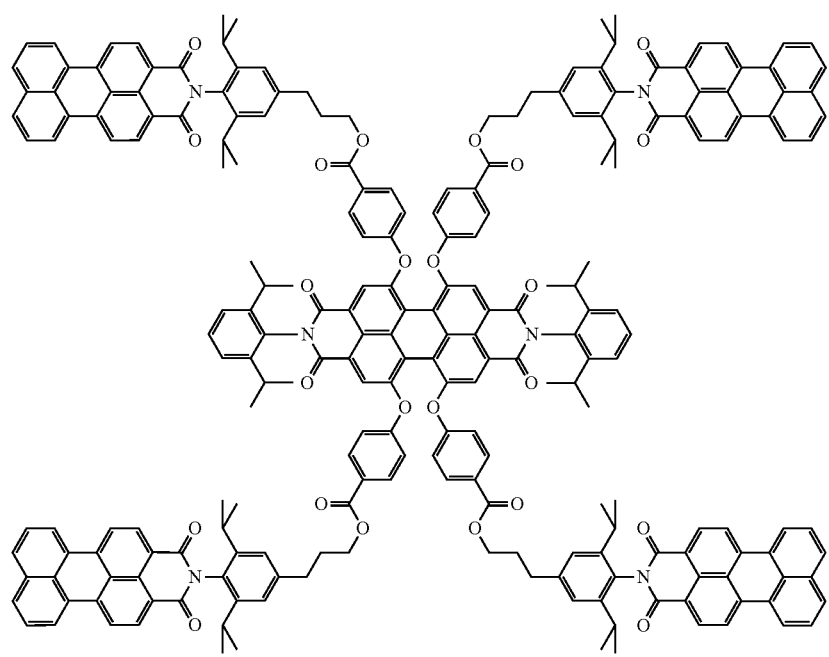
2517
and

-continued
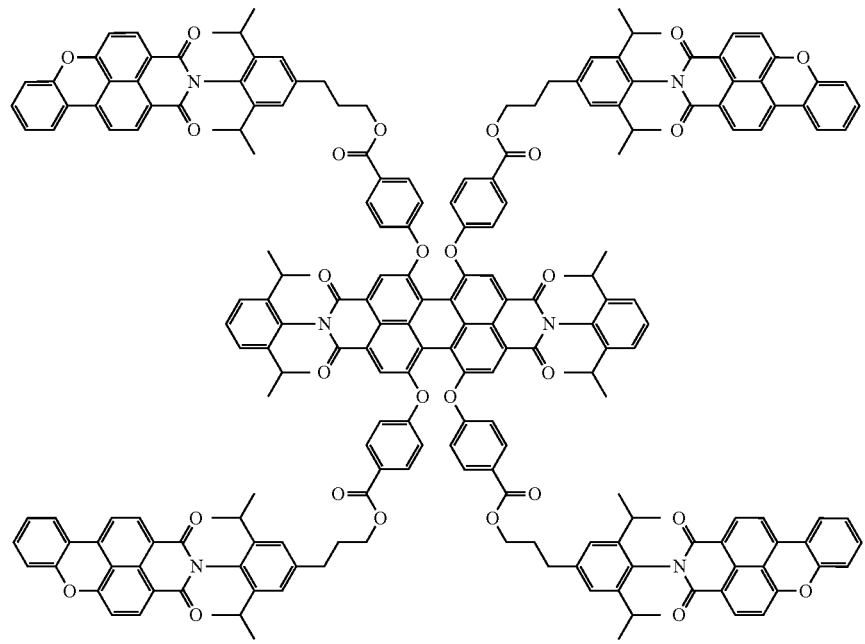
2440
and derivatives thereof.
13. A lighting device comprising a light source configured to provide light source light and a luminescent material as defined in claim 11 configured to convert at least part of the light source light into luminescent molecule light.
* * * * *